(12) United States Patent
Dupuis

(10) Patent No.: US 7,447,492 B2
(45) Date of Patent: Nov. 4, 2008

(54) ON CHIP TRANSFORMER ISOLATOR

(75) Inventor: Timothy Dupuis, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 685 days.

(21) Appl. No.: 10/860,519

(22) Filed: Jun. 3, 2004

(65) Prior Publication Data

US 2005/0269657 A1 Dec. 8, 2005

(51) Int. Cl.
*H04B 1/28* (2006.01)
*H04B 1/16* (2006.01)
*H01L 29/207* (2006.01)
*H01L 33/00* (2006.01)
*H01F 21/02* (2006.01)

(52) U.S. Cl. .................. 455/333; 455/338; 455/292; 257/93; 336/145

(58) Field of Classification Search ............... 455/280, 455/292, 67.15, 333, 338, 148, 167.1, 274, 455/286; 257/93, 446, 499; 336/131, 145
See application file for complete search history.

(56) References Cited

U.S. PATENT DOCUMENTS

| 3,058,078 | A | 10/1962 | Hoh |
| 3,537,022 | A | 10/1970 | Regan |
| 3,713,148 | A | 1/1973 | Cardullo et al. |
| 3,714,540 | A | 1/1973 | Galloway |
| 3,760,198 | A | 9/1973 | Mori et al. |
| 3,798,608 | A | 3/1974 | Huebner |
| 3,859,624 | A | 1/1975 | Kriofsky et al. |
| 4,024,452 | A | 5/1977 | Seidel |
| 4,027,152 | A | 5/1977 | Brown et al. |
| 4,118,603 | A | 10/1978 | Humhyr |
| 4,227,045 | A | 10/1980 | Chelcun et al. |
| 4,302,807 | A | 11/1981 | Mentler |
| 4,425,647 | A | 1/1984 | Collins et al. |
| 4,459,591 | A | 7/1984 | Wesemeyer et al. |
| 4,523,128 | A | 6/1985 | Stamm et al. |
| 4,536,715 | A | 8/1985 | Basarath et al. |
| 4,538,136 | A | 8/1985 | Drabing |
| 4,547,961 | A | 10/1985 | Bokil et al. |

(Continued)

FOREIGN PATENT DOCUMENTS

GB 2173956 A1 10/1986

(Continued)

OTHER PUBLICATIONS

Zhou, Jianjun, Monolithic Transformers and Their Application in a Differential CMOS RF Low-Noise Amplifier, IEEE Journal of Solid-State Circuits, Dec. 1998, vol. 33, No. 12, pp. 2020-2027.

(Continued)

*Primary Examiner*—Matthew Anderson
*Assistant Examiner*—Eugene Yun
(74) *Attorney, Agent, or Firm*—Howison & Arnott, L.L.P.

(57) ABSTRACT

An integrated circuit having voltage isolation capabilities includes a first area of the integrated circuit containing functional circuitry that is located in the substrate of the integrated circuit. A second area of the integrated circuit contains an integrated RF isolation circuitry for voltage isolating the functional circuitry. The RF isolation circuitry is located in the metal layers of the integrated circuit.

21 Claims, 16 Drawing Sheets

U.S. PATENT DOCUMENTS

| | | |
|---|---|---|
| 4,650,981 A | 3/1987 | Foletta |
| 4,675,579 A | 6/1987 | Hardy et al. |
| 4,703,283 A | 10/1987 | Samuels |
| 4,748,419 A | 5/1988 | Somerville |
| 4,763,075 A | 8/1988 | Weigert |
| 4,780,795 A | 10/1988 | Meinel |
| 4,785,345 A | 11/1988 | Rawls et al. |
| 4,791,326 A | 12/1988 | Vajdic et al. |
| 4,817,865 A | 4/1989 | Wray |
| 4,818,855 A | 4/1989 | Mongeon et al. |
| 4,825,450 A | 4/1989 | Herzog |
| 4,835,486 A | 5/1989 | Somerville |
| 4,853,654 A | 8/1989 | Sakurai |
| 4,859,877 A | 8/1989 | Cooperman et al. |
| 4,864,437 A | 9/1989 | Couse et al. |
| 4,868,647 A | 9/1989 | Uehara et al. |
| 4,885,582 A | 12/1989 | LaBarge et al. |
| 4,922,883 A | 5/1990 | Iwasaki |
| 4,924,210 A | 5/1990 | Matsui et al. |
| 4,931,867 A | 6/1990 | Kikuchi |
| 4,937,468 A | 6/1990 | Shekhawat et al. |
| 4,945,264 A | 7/1990 | Lee et al. |
| 4,959,631 A | 9/1990 | Hasegawa et al. |
| 5,041,780 A | 8/1991 | Rippel |
| 5,057,968 A | 10/1991 | Morrison |
| 5,095,357 A | 3/1992 | Andoh et al. |
| 5,102,040 A | 4/1992 | Harvey |
| 5,128,729 A | 7/1992 | Alonas et al. |
| 5,142,432 A | 8/1992 | Schneider |
| 5,164,621 A | 11/1992 | Miyamoto et al. |
| 5,168,863 A | 12/1992 | Kurtzer |
| 5,204,551 A | 4/1993 | Bjornholt |
| 5,270,882 A | 12/1993 | Jove et al. |
| 5,293,400 A | 3/1994 | Monod et al. |
| 5,369,666 A | 11/1994 | Folwell et al. |
| 5,384,808 A | 1/1995 | Van Brunt et al. |
| 5,396,394 A | 3/1995 | Gee |
| 5,404,545 A | 4/1995 | Melvin |
| 5,418,933 A | 5/1995 | Imai et al. |
| 5,424,709 A | 6/1995 | Tal |
| 5,442,303 A | 8/1995 | Asada et al. |
| 5,444,740 A | 8/1995 | Mizukami et al. |
| 5,448,469 A | 9/1995 | Rilly et al. |
| 5,467,607 A | 11/1995 | Harvey |
| 5,469,098 A | 11/1995 | Johnson, Jr. |
| 5,484,012 A | 1/1996 | Hiratsuka |
| 5,533,054 A | 7/1996 | DeAndrea et al. |
| 5,539,598 A | 7/1996 | Denison et al. |
| 5,544,120 A | 8/1996 | Kuwagata et al. |
| 5,555,421 A | 9/1996 | Enzinna |
| 5,568,333 A | 10/1996 | Bang |
| 5,572,179 A | 11/1996 | Ito et al. |
| 5,588,021 A | 12/1996 | Hunt et al. |
| 5,591,996 A | 1/1997 | Haigh et al. |
| 5,596,466 A | 1/1997 | Ochi |
| 5,615,091 A | 3/1997 | Palatnik |
| 5,615,229 A | 3/1997 | Sharma et al. |
| 5,625,265 A | 4/1997 | Vlahu |
| 5,627,480 A | 5/1997 | Young et al. |
| 5,650,357 A | 7/1997 | Dobkin et al. |
| 5,654,984 A | 8/1997 | Hershbarger et al. |
| 5,663,672 A | 9/1997 | Nuechterlein |
| 5,701,037 A | 12/1997 | Weber et al. |
| 5,714,938 A | 2/1998 | Schwabi |
| 5,716,323 A | 2/1998 | Lee |
| 5,731,727 A | 3/1998 | Iwamoto et al. |
| 5,731,954 A | 3/1998 | Cheon |
| 5,774,791 A | 6/1998 | Strohallen et al. |
| 5,781,071 A | 7/1998 | Kusunoki |
| 5,781,077 A | 7/1998 | Leitch et al. |
| 5,786,763 A | 7/1998 | Canipe |
| 5,786,979 A | 7/1998 | Douglass |
| 5,789,960 A | 8/1998 | Bower |
| 5,801,602 A | 9/1998 | Fawal et al. |
| 5,812,597 A | 9/1998 | Graham et al. |
| 5,812,598 A | 9/1998 | Sharma et al. |
| 5,825,259 A | 10/1998 | Harpham et al. |
| 5,831,426 A | 11/1998 | Black, Jr. et al. |
| 5,831,525 A | 11/1998 | Harvey |
| 5,844,743 A | 12/1998 | Funches |
| 5,845,190 A | 12/1998 | Bushue et al. |
| 5,850,436 A * | 12/1998 | Rosen et al. ................ 379/377 |
| 5,864,607 A | 1/1999 | Rosen et al. |
| 5,900,683 A | 5/1999 | Rinehart et al. |
| 5,907,481 A | 5/1999 | Svardsjo |
| 5,913,817 A | 6/1999 | Lee |
| 5,926,358 A | 7/1999 | Dobkin et al. |
| 5,945,728 A | 8/1999 | Dobkin et al. |
| 5,952,849 A * | 9/1999 | Haigh ........................ 326/82 |
| 5,969,590 A | 10/1999 | Gutierrez |
| 6,049,258 A | 4/2000 | Fawal et al. |
| 6,054,780 A | 4/2000 | Haigh et al. |
| 6,061,009 A | 5/2000 | Krone et al. |
| 6,069,802 A | 5/2000 | Priegnitz |
| 6,081,112 A | 6/2000 | Carobolante et al. |
| 6,082,744 A | 7/2000 | Allinger et al. |
| 6,087,882 A | 7/2000 | Chen et al. |
| 6,097,564 A | 8/2000 | Hunter |
| 6,104,003 A | 8/2000 | Jones |
| 6,114,937 A | 9/2000 | Burghartz et al. |
| 6,124,756 A | 9/2000 | Yaklin et al. |
| 6,137,372 A | 10/2000 | Welland |
| 6,222,922 B1 | 4/2001 | Scott et al. |
| 6,232,902 B1 | 5/2001 | Wada |
| 6,249,171 B1 | 6/2001 | Yaklin et al. |
| 6,262,600 B1 | 7/2001 | Haigh et al. |
| 6,291,907 B1 | 9/2001 | Haigh et al. |
| 6,307,497 B1 | 10/2001 | Leung et al. |
| 6,384,763 B1 | 5/2002 | Leung et al. |
| 6,389,063 B1 | 5/2002 | Kanekawa et al. |
| 6,396,652 B1 | 5/2002 | Kawachi et al. |
| 6,441,987 B1 | 8/2002 | Lee |
| 6,452,519 B1 | 9/2002 | Swanson |
| 6,525,566 B2 | 2/2003 | Haigh et al. |
| 6,535,858 B1 | 3/2003 | Blaukovitsch et al. |
| 6,538,136 B1 | 3/2003 | Rizzo et al. |
| 6,603,807 B1 | 8/2003 | Yukutake et al. |
| 6,611,051 B2 | 8/2003 | Akiyama et al. |
| 6,670,861 B1 | 12/2003 | Balboni |
| 6,720,816 B2 | 4/2004 | Strzalkowski |
| 6,728,320 B1 | 4/2004 | Khasnis et al. |
| 6,747,522 B2 | 6/2004 | Pietruszynski et al. |
| 6,833,800 B1 | 12/2004 | Patterson |
| 6,873,065 B2 | 3/2005 | Haigh et al. |
| 6,902,967 B2 | 6/2005 | Beasom |
| 6,903,578 B2 | 6/2005 | Haigh et al. |
| 6,914,547 B1 | 7/2005 | Swaroop et al. |
| 6,922,080 B2 | 7/2005 | Haigh et al. |
| 6,927,662 B2 | 8/2005 | Kahlmann et al. |
| 6,940,445 B2 | 9/2005 | Kearney |
| 6,956,727 B1 | 10/2005 | Brokaw |
| 6,967,513 B1 | 11/2005 | Balboni |
| 6,977,522 B1 | 12/2005 | Murabayashi et al. |
| 7,016,490 B2 | 3/2006 | Beutler et al. |
| 7,023,372 B1 | 4/2006 | Singh et al. |
| 7,053,831 B2 | 5/2006 | Dempsey et al. |
| 7,057,491 B2 | 6/2006 | Dempsey |
| 7,075,329 B2 | 7/2006 | Chen et al. |
| 7,102,388 B2 | 9/2006 | Murabayashi et al. |
| 7,053,807 B1 | 5/2007 | Gaalaas |

2005/0053229 A1 3/2005 Tsatsanis et al.

FOREIGN PATENT DOCUMENTS

JP 1982 57-132460 8/1982
WO 98/22307 A1 5/1998

OTHER PUBLICATIONS

Zhou, Jian-Jun and Allstot, David, A Fully Integrated CMOS 900MHz LNA Utilitzing Monolithic Transformers, ISSCC 1998 Digest of Technical Papers, pp. 132-133.
Akiyama, Noboru, A High-Voltage Monolithic Isolator for a Communication Network Interface, IEEE Transactions on Electron Devices, May 2002, pp. 895-901, vol. 49, No. 5.
Martel, Jesus, Analysis of a Microstrip Crossover Embedded in a Multilayered Anisotropic and Lossy Media, IEEE Transactions on Microwave Theory and Techniques, Mar. 1994, pp. 424-432, vol. 32, No. 3.
Baker, Bonnie C., The Basics of Isolation Circuits, Sensors and Systems, May 1996, pp. 46-47.
Bindra, Ashok, MEMS-Based Magnetic Coils Exceed the Limitations of Optical Couplers, Electronic Design, Jul. 24, 2000, p. 43.
Choina, Simon, Planar Transformers Make Maximum Use of Precious Board Space, Electronic Design, Mar. 9, 1999, pp. 97 & 99.
Clark, Ron, RS-232C/422/485 Line Isolation Solves More Than Fault Problems, EDN, Sep. 28, 1995, pp. 103-115.
EDN's 100 Top Products 1994, EDN, Dec. 8, 1994, pp. 58.
"Publications—Geoff Walker", http://www.itee.uq.edu.au/~walkerg/publications/pubs_grw_links.html, May 2007.
Hoskins, Kevin, Isolated ADC Reduces Power Consumption, EDN, Mar. 30, 1995, pp. 73-74.
Simburger, Werner, A Monolithic Transformer Coupled 5-W Silicon Power Amplifier with 59% PAE at .9Ghz, IEEE Journal of Solid-State Circuits, Dec. 1999, vol. 34, No. 12, pp. 1881-1892.
Long, John R., Monolithic Transformers for Silicon RF IC Design, IEEE Journal of Solid-State Circuits, Sep. 2000, vol. 35, No. 9, pp. 1368-1382.
Wolfs, P.J., An Improved Transformer Coupled MOSFET/IGBT Driver, Journal of Electrical and Electronic Engineering, Australia—IE Aust. & IREE Aust., Sep. 1991, vol. 11, No. 03, pp. 197-200.
Klein William, Applications of Signal Isolation, Sensors Magazine, Apr. 2000, pp. 70-74.
Kojima, Yasuyuki, A Novel Monolithic Isolator for a Communications Network Interface IC, 1998 Proceedings Annual IEEE International ASIC Conference, 1998, pp. 255-258.
Kojima, Yasuyuki, 2.3 kVac 100 MHz Multi-Channel Monolithic Isolator IC, 2000 Proceedings Annual IEEE International ASIC Conference, 2000, pp. 309-312.
Kuhn, William, An RF-Based IEEE 1394 Ground Isolator Designed in a Silicon-on-Insulator Process, 44th IEEE 2001 Midwest Symposium on Circuits and Systems, pp. 764-767.
Lam, Sam, High-Isolation Bonding Pad Design for Silicon RFIC up to 20 GHz, IEEE Electron Device Letters, Sep. 2003, vol. 24, No. 5, pp. 601-603.
Long, John R., A 1.9 GHz Low-Voltage Silicon Bipolar Receiver Front-End for Wireless Personal Communications Systems, IEEE Journal of Solid-State Circuits, Dec. 1995, vol. 30, No. 12, pp. 1438-1448.
Mammano, Bob, Isolated Power Conversion: making the case for secondary-side control, EDN, Jun. 7, 2001, pp. 123-127.
Green, M.W. Miniature Multilayer Spiral Inductors for GsAs MMICs, 1989 IEEE GaAs Symposium, 1989, pp. 303-306.
Walker, Geoffry, Modulation and Control of Multilevel Converters, Thesis submitted for Doctor of Philosophy (The University of Queensland), Nov. 16, 1999, pp. 1-202.
Pickering, Paul, A System Designer's Guide to Isolation Devices, Sensors, Jan. 1999, pp. 14-26.
Ronkainen, H., IC compatible planar inductors on silicon, IEE Proc.-Circuits Devices Syst., Feb. 1997, vol. 144, No. 1, pp. 29-35.
Schweher, Bill, DAAs go for the Silicon, EDN, Feb. 17, 2000, pp. 119-130.
Schweber, Bill, MEMS-Based Digital Isolator Answers Need for Extreme I/O Speed, EDN, Jul. 20, 2000, p. 24.
Sorenson, Jeff, Direct-Access Arrangements Are Crucial to Successful Embedded-Modem Designs, Electronic Design, Aug. 20, 2001, pp. 66-78.
Stapleton, Helen, Isolation Techniques for High-resolution Data-acquisition Systems, EDN, Feb. 1, 2000, pp. 113-118.
A Tale of Two Modems, Sensors Magazine, Apr. 2002, pp. 30-32.
Knoedl, G., A Monolithic Signal Isolator, IEEE, 1989, pp. 165-170.
Young, Ron, Feedback Isolation Auguments Power-Supply Safety and Performance, EDN, Jun. 19, 1997, pp. 141-146.
IEEE Standard for a High Performance Serial Bus, IEEE Std. 1395-1995, Dec. 1995, pp. 1-392, NY.
Ichiro Aoki et al.; Fully Integrated CMOS Power Amplifier Design Using the Distributed Active-Transformer Architecture; IEEE Journal of Solid State Circuits, vol. 37, No. 3, Mar. 2002; pp. 371-383.
Kilger, R. et al., "Micromachined magnetics: a new step in the evolution of isolation technology," Electronic Engineering, Jun. 2000 at pp. 27-32.
Kester, W., Origins of Real-World Signals and Their Units of Measurement, Mixed-signal and DSP Design Techniques,Newnes 2003, Ch. 1; pp. 1.1-1.11.
Bourgeois, J.M., "PCB Based Transformer for Power MOSFET Drive," IEEE, 0-7803-1456-5/94, 1994; pp. 238-244.

* cited by examiner

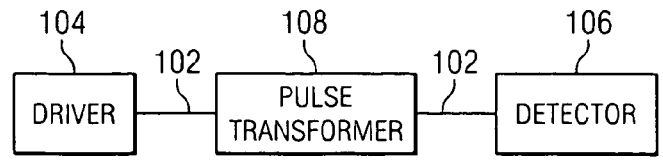
FIG. 1 (PRIOR ART)
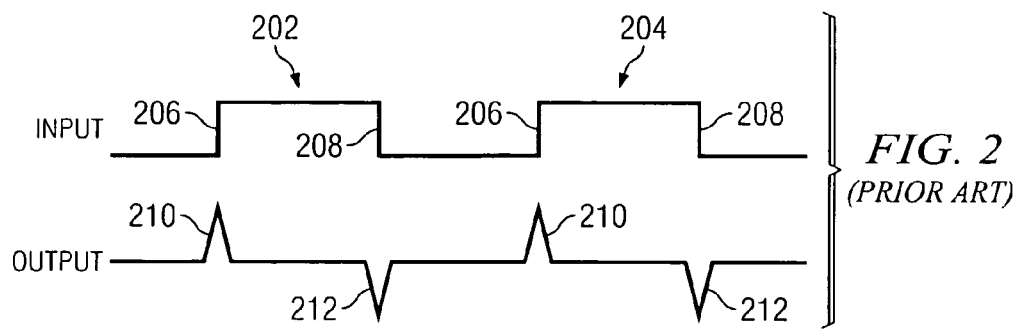
FIG. 2 (PRIOR ART)
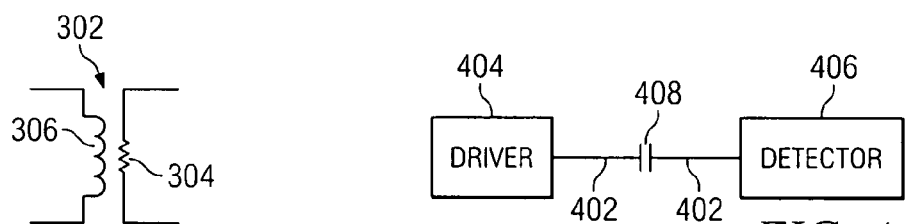
FIG. 3 (PRIOR ART)
FIG. 4 (PRIOR ART)
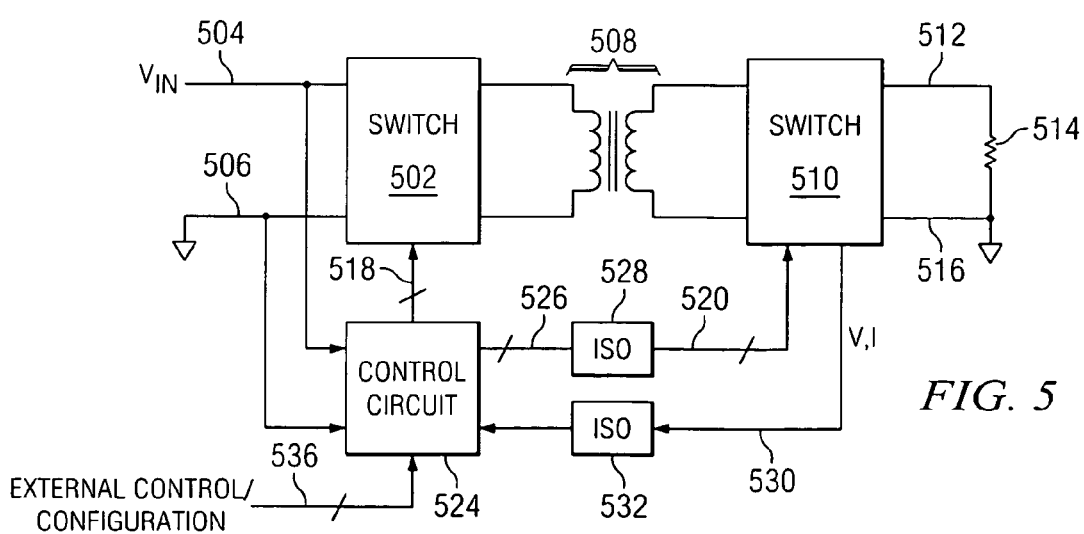
FIG. 5

US 7,447,492 B2

ON CHIP TRANSFORMER ISOLATOR

TECHNICAL FIELD OF THE INVENTION

The present invention relates to digital isolators, and more particularly to digital isolators using RF for transmitting information across the isolation barrier.

BACKGROUND OF THE INVENTION

Within power conversion products, there is a need for high speed digital links that provide high isolation at a low cost. Typical digital links within power conversion products require a speed of 50-100 megabits per second. Isolation between the input and output of power conversion products is required in the range of 2,500-5,000 volts. Existing solutions for providing a high speed digital isolation link have focused on the use of magnetic pulse couplers, magnetic resistive couplers, capacitive couplers and optical couplers.

Referring now to FIG. 1, there is illustrated the general block diagram of a system using a magnetic pulse coupler to isolate a digital link 102 between a driver 104 and a detector 106. The driver 104 resides upon one side of the digital link 102 and transmits information over the digital link 102 to the detector 106 residing on the other side of the digital link. Resting between the driver 104 and detector 106 is a pulse transformer 108. The pulse transformer 108 provides a magnetically coupled transformer between the driver 104 and detector 106. The pulse transformer 108 generates a pulse output in response to a provided input from the driver as illustrated in FIG. 2. The input from the driver 104 consists of the two pulses 202 and 204. Each pulse 202, 204 consists of a rising edge 206 and a falling edge 208. In response to a rising edge 206, the output of the pulse transformer 108 generates a positive pulse 210. The falling edge 208 of a pulse generates a negative pulse 212. The pulse transformer circuit illustrated with respect to FIGS. 1 and 2 suffers from a number of deficiencies. These include start-up where the detector 106 will not know at what point the input from the driver has begun, whether high or low until a first edge is detected. Additionally, should any error occur in the pulse output of the pulse transformer 108, the detector 106 would have a difficult time determining when to return to a proper state since there may be a long period of time between pulses.

Referring now to FIG. 2, there is illustrated an alternative prior art solution making use of a magneto resistive coupler. The magneto resistive coupler 302 consists of a resistor 304 and associated transformer 306. The resistor 304 has a resistance value that changes responsive to the magnetic flux about the resistor. The transformer detector 306 utilizes a wheatstone bridge to detect the magnetic flux of the resistor and determined transmitted data.

Another method of isolation between a driver 404 and a detector 406 is illustrated in FIG. 4. The driver 404 and the detector 406 are isolated on opposite sides of a digital link 402 by a capacitor 408. The capacitor 408 capacitively couples the driver 404 and detector 406 together to achieve a level of isolation. A problem with the use of capacitive coupling to isolate digital links is that capacitive coupling provides no common mode rejection.

Thus, an improved method for providing isolation over high speed digital links within power supply components would be greatly desirable.

SUMMARY OF THE INVENTION

The present invention disclosed and claimed herein, in one aspect thereof, comprises an integrated circuit having voltage isolation capabilities. The integrated circuit includes a first area containing functional circuitry that is located within the substrate of the integrated circuit. The integrated circuit also includes a second area containing an integrated RF isolation circuit for providing voltage isolation of the functional circuitry in the first area. The RF isolation circuit is located in the metal layers of the integrated circuit.

BRIEF DESCRIPTION OF THE DRAWINGS

For a more complete understanding of the present invention and the advantages thereof, reference is now made to the following description taken in conjunction with the accompanying Drawings in which:

FIG. 1 illustrates a block diagram of a prior art magnetic pulse coupler isolator;

FIG. 2 illustrates the input and output signals of the prior art magnetic pulse transformer of FIG. 1;

FIG. 3 illustrates a prior art magneto resistive coupler;

FIG. 4 illustrates a prior art capacitive coupler;

FIG. 5 illustrates a switched power supply including isolation circuitry;

FIG. 14c is a block diagram of the logic circuit of FIG. 17a;

DETAILED DESCRIPTION OF THE INVENTION

Figure 6:
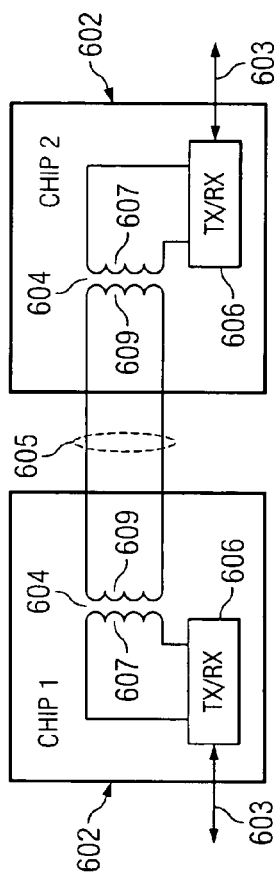
FIG. 6 illustrates an RF isolation link of the present disclosure.

Referring now to the drawings, and more particularly to FIG. 5, there is illustrated a block diagram of a DC-DC switching power supply utilizing an RF isolation link. Switching power supplies utilize a plurality of switches which are turned on and off to switch an input DC voltage across a transformer to a load, the output voltage at a different DC voltage level. By switching the current inductively coupled through the transformer to the load in a particular manner, a DC output voltage at a different voltage level than the input DC voltage can be provided to the load. The controlled switching is typically facilitated with some type of control circuit. This control circuit can be an analog control circuit formed from a plurality of analog discrete devices, or it can be a digital circuit. In digital control circuits, digital signal processors (DSPs) and microcontroller units (MCU) have been utilized. The DSPs control the duty cycle and relative timing of the switches such that the edges of each control pulse to the various transistor switches controlling power delivery to the load is varied. In order to perform this operation in the digital domain, the DSP must perform a large number of calculations, which requires a fairly significant amount of code to be generated to support a specific power supply topology, operating frequency, component characteristics and performance requirements. For example, inductor size decreases with increasing PWM frequency, dead times increase with increasing transistor turn-off times, and so on. Although DSPs can handle the regulation tasks, they are fairly complex and expensive and code changes in power supply applications are difficult.

Referring further to FIG. 5, the power supply includes a primary switch group 502 that is operable to receive an input voltage on a node 504, this being a DC voltage, and ground on a node 506. The primary switch group 502 is coupled through an isolation transformer 508 to a secondary switch group 510. The secondary switch group 510 is operable to drive an input voltage node 512 that is connected to one terminal of a load 514, the secondary switch group 510 also having a ground connection on a node 516, the load 514 disposed between the node 512 and the node 516. The two switch groups 502 and 510 are operable to operate in conjunction with various pulse inputs on a control bus 518 associated with the primary switch group 502 and with various pulse inputs on a control bus 526 associated with the secondary switch group 510.

A digital control circuit 524 is provided for controlling the operation of the primary switch group 502 and the secondary switch group 510. The voltages on nodes 504 and 506 are provided as inputs to the digital control circuit 524 for sensing the voltage and current on the primary side, the digital control circuit 524 generating the information on the bus 518 for control of the primary switch group 502. The control circuit 524 must be isolated from the secondary group switch 510, since there can be a significant DC voltage difference there between. This is facilitated by driving the bus 526 through an isolation circuit 528, such as the RF isolation circuit which will be discussed herein below, to drive the bus 520. Similarly, the control circuit 524 is operable to sense the voltage and current levels on the output node 512 through sense lines 530 which are also connected through an isolation circuit 532 to the digital control circuit 524. The digital control circuit 524 is also interfaced to a bus 536 to receive external control/configuration information. This can be facilitated with a serial databus such as an SMB serial databus.

Referring now to FIG. 6, there is illustrated the RF isolation link of the present disclosure. The RF isolation link 600 of the present disclosure is implemented by integrating a portion of the link in two chips or dies between which a high rate data link with voltage isolation is required. Each chip 602 includes a transformer 604 and transmit and receive circuitry 606 for providing the RF isolation link 600 between the chips. Alternatively, the chip 602 could include only transmit circuitry or receive circuitry with the partnered chip, including a corresponding receiver or transmitter. The RF signals are generated within the transmit/receive circuitry 606 on one side of the RF isolation link, and the RF signals are transmitted between the chips 602 utilizing the transformers 604 in each chip and the magnetic coupling effect there between.

Once the RF signals are received at the receiving side, the transmit and receive circuitry 606 detects the data contained within the transmission from the first chip and utilizes the data as appropriate. While the description with respect to FIG. 6 only illustrates the transformer 604 and transmit and receive circuitry 606 within each chip 602, additional circuitry will be implemented on the chips 602 for performing processing functions associated with the data transmitted over the RF isolation link 600. The data transmitted over the RF isolation link 600 may be transmitted using either frequency modulation techniques or amplitude modulation techniques. In the preferred embodiment of the disclosure, discussed with respect to FIG. 7 herein below, AM modulation is used for transmitting the data.

In operation, each of the transmit/receive circuits 606 operates in either transmit or receive mode. In the transmit mode, digital data received on a digital bus 603 is serially transmitted from one of the transmit/receive circuit 606 to the other one on the other of the dies 602. This is facilitated by driving the transformer 606 with a signal such that energy is coupled from the primary to the secondary thereof. This will allow energy to be transmitted on transmission lines 605 that couple the transformers 604 together. Each of the transformers is comprised of a primary 607 and a secondary 609. The primary 607 is driven with the input signal and energy associated therewith is coupled across the high voltage isolation boundary from the primary 607 to the secondary 609 and onto the transmission line 605. As will be described herein below, both of the transmit/receive circuits 606 and transformers 604 are all fabricated on an integrated circuit such that the primary 607 and secondary 609 are both formed thereon utilizing conventional processing techniques and available conductive layers that are shared with the transmit/receive circuits. There will be a loss associated with the coupling coefficient between the primary and secondary such that the amount of energy that can be delivered from the transmit/receive circuit 606 to the transmission line 605 is reduced and, further, there will be more loss at certain frequencies than others. As such, the transformer 604 will have a unique frequency response where the loss will be greater at some frequencies than others. To accommodate this, the transmit/receive circuit 606 has contained therein a transmitter operating at a defined frequency that is within the lowest loss portion of the frequency response of the transformer 604. By utilizing various modulation schemes, data can be transmitted on this carrier to the transmission line 605. The operation of the transmitter/receiver circuit 606 will be described in more detail herein below.

Figure 6A:
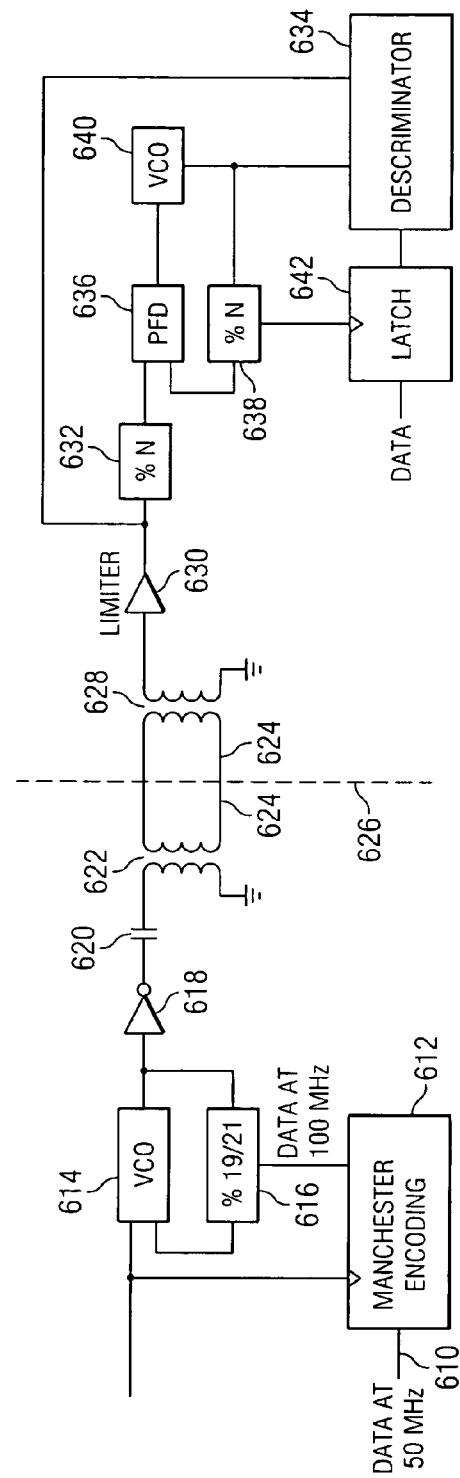
FIG. 6a illustrates a schematic block diagram of a circuit for providing the RF isolation link using frequency modulation.

Referring now to FIG. 6a, there is illustrated an alternate embodiment of the switching power supply utilizing frequency modulation to transmit data between a pair of chips over an RF isolation link 600. The description with respect to FIG. 6a is merely provided as an illustration of one potential embodiment of an FM circuit used for creating an RF isolation link, and one skilled in the art would realize the possibility of numerous additional embodiments. The data is input on a data bus 610 into a Manchester encoding circuit 612, a conventional data encoding circuit. Also input to the Manchester encoding circuit 612 is a clock signal. The clock signal is also input to a voltage controlled oscillator 614. Data is output from the Manchester encoding circuit 612 and applied to a divide circuit 616. A second input of the divide circuit 616 is connected to the output of the voltage controlled oscillator 614. The output of the divide circuit 616 is connected to a second input of the voltage controlled oscillator 614 to allow modulation thereof with the Manchester encoding circuit 616. The voltage controlled oscillator 614 outputs a frequency modulated signal representing the received data on bus 610 to a driver 618. The signal is filtered by a capacitor 620 before being applied to a transformer 622. The FM modulated signal is coupled by transformer 622 onto transmission lines 624 passing across an interface 626 between either a first and second chip that are to be voltage isolated from each other.

The received data signal is magnetically coupled onto the receiver circuitry by a second transformer 628. The received signal passes through a limiter circuit 630 whose output is applied to a Divide-by-N circuit 632 and a discriminater circuit 634. The output of the Divide-by-N circuit 632 is applied to the input of a PFD (phase/frequency detector) circuit 636. A second input to the PFD circuit 636 is provided by a second Divide-by-N circuit 638 having its input connected to the output of the voltage controlled oscillator 640. The input of the voltage controlled oscillator 640 is connected to the output of the PFD circuit 636. The output of the voltage controlled oscillator 640 is connected to a second input of the discriminater 634, this being a phase locked output phase locked to the data clock. The discriminater circuit 634 determines the data contained within the received signal responsive to the output of the voltage controlled oscillator 640 and the limiter 630. This data is provided to a latch circuit 636 having its clock input connected to the output of the Divide-by-N circuit 638. The data output of the receiver is provided from the latch circuit 642.

Figure 7:
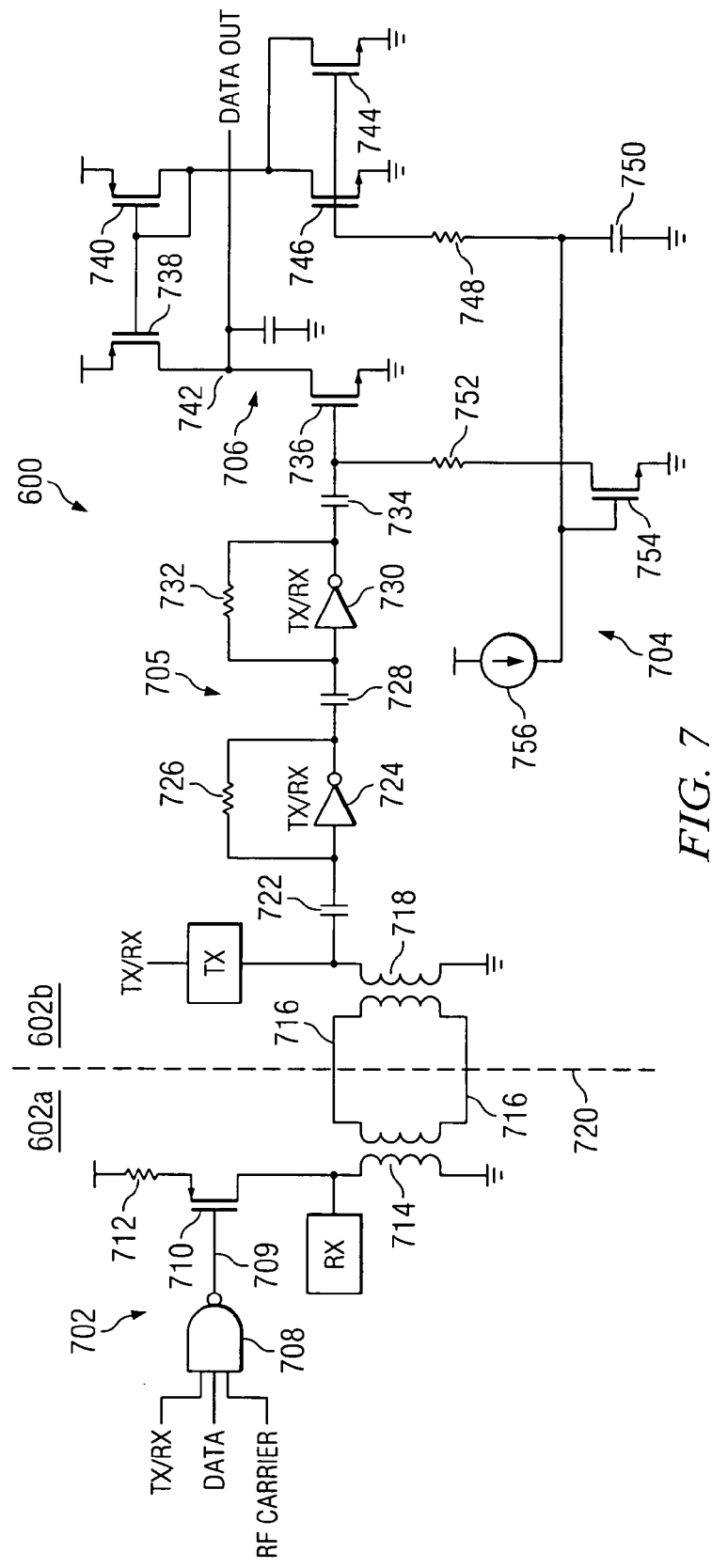
FIG. 7 illustrates a schematic diagram of the circuitry for providing the RF isolation link using amplitude modulation.

Referring now to FIG. 7, there is illustrated the preferred embodiment of the RF isolation link 600 of the present disclosure wherein amplitude modulation is used to transmit data over the link. The RF isolation link 600 consists of transmitter circuitry 702 and receiver circuitry 704. The transmitter circuitry 702 consists of a NAND gate 708 having a first input connected to receive the data to be transmitted over the RF isolation link 600 and a second input connected to receive the RF carrier signal. The RF carrier in the preferred embodiment comprises a 2 GHz signal. The data input to the first input of the NAND gate 708 consists of either a logical "1" or "0" which will selectively gate the RF carrier signal to the output of NAND gate 708 in the presence of a logical "1." This causes the output 709 of the NAND gate 708 to either provide the RF carrier signal when the data bit is "1" or not provide the RF signal when the data bit is "0." The output of the NAND gate 709 is connected to the gate of a p-channel transistor 710. The drain-source path of the p-channel resistor 710 is connected between $V_{DD}$ and ground through a resistor 712 and a first transformer 714. The transformer 714 electromagnetically couples the RF carrier signal to transformer 718 via lines 716. This links the data represented by the RF carrier signal between the first chip 602a and the second chip 602b while providing voltage isolation between the chips 602 via the first and second transformers 714, 718. Each of the transformers 714 and 718 are associated with a particular chip 602 on opposite sides of interface 720. Thus, wherein previous systems required a separate chip to provide an isolation link between two separate chips, the present disclosed device integrates the RF isolation link 600 onto the chips 602.

The receiver circuitry 704 receives the signal which has been electromagnetically coupled via transformer 714 onto the transmission lines 716 to transformer 718. The receiver circuit 704 consists of an amplifier 705 and a detector 706. The amplifier 705 provides two stages of amplification consisting of a first amplification stage including a capacitor 722 in series with an amplifier 724 and a feedback resistor 726. The second amplifier stage is similar to the first amplifier stage and includes a capacitor 728 in series with an amplifier 730 and a feedback resistor 732. These two stages amplify the received signal from the transformer 718.

The detector 706 detects the presence or absence of the RF carrier signal within the amplified received signal to determine the data being transmitted from the first chip 602a. The amplified signal from the amplifier 705 is first filtered by a capacitor 734. N-channel transistor 736 has the gate thereof connected to capacitor 734 and has the source-drain path thereof connected to one side of a current mirror comprised of p-channel transistors 738 and 740. The source-drain path of transistor 738 is connected between $V_{DD}$ and node 742, the gate thereof connected to the gate of transistor 740. The source-drain path of transistor 740 is connected between $V_{DD}$ and a node 743, the gate thereof connected to node 743 to provide a diode connected configuration. The output of the detector 706 is provided from node 742 at which the source-drain path of the n-channel transistor 736 is connected to the p-channel transistor 738 of the current mirror. A bias network is provided by n-channel transistors 744 and 746 which have the source-drain paths thereof connected between node 743 and ground and the gates thereof connected to a node 745 through a resistor 748, with a capacitor 750 connected between node 745 and ground. Biasing is also provided by resistor 752 connected between node 745 and the gate of transistor 736, a diode connected p-channel transistor 754 connected between node 745 and ground and a current source 756 for driving node 745. When no RF signal is detected by the receiver, the Data Out from node 742 of the detector circuit 706 will be equal to $V_{DD}$ since the PMOS current is greater than 1.33 times the NMOS current and a logical "0" is detected. In the presence of the RF signal, the Data Out from node 742 will vary in response to the variation of the detected RF carrier signal and a logical "1." The detector 706 outputs a low voltage when RF is present and a high voltage when RF is absent relying on the nonlinear (square root) behavior of the MOS device directed by the alternating current.

Figure 8:
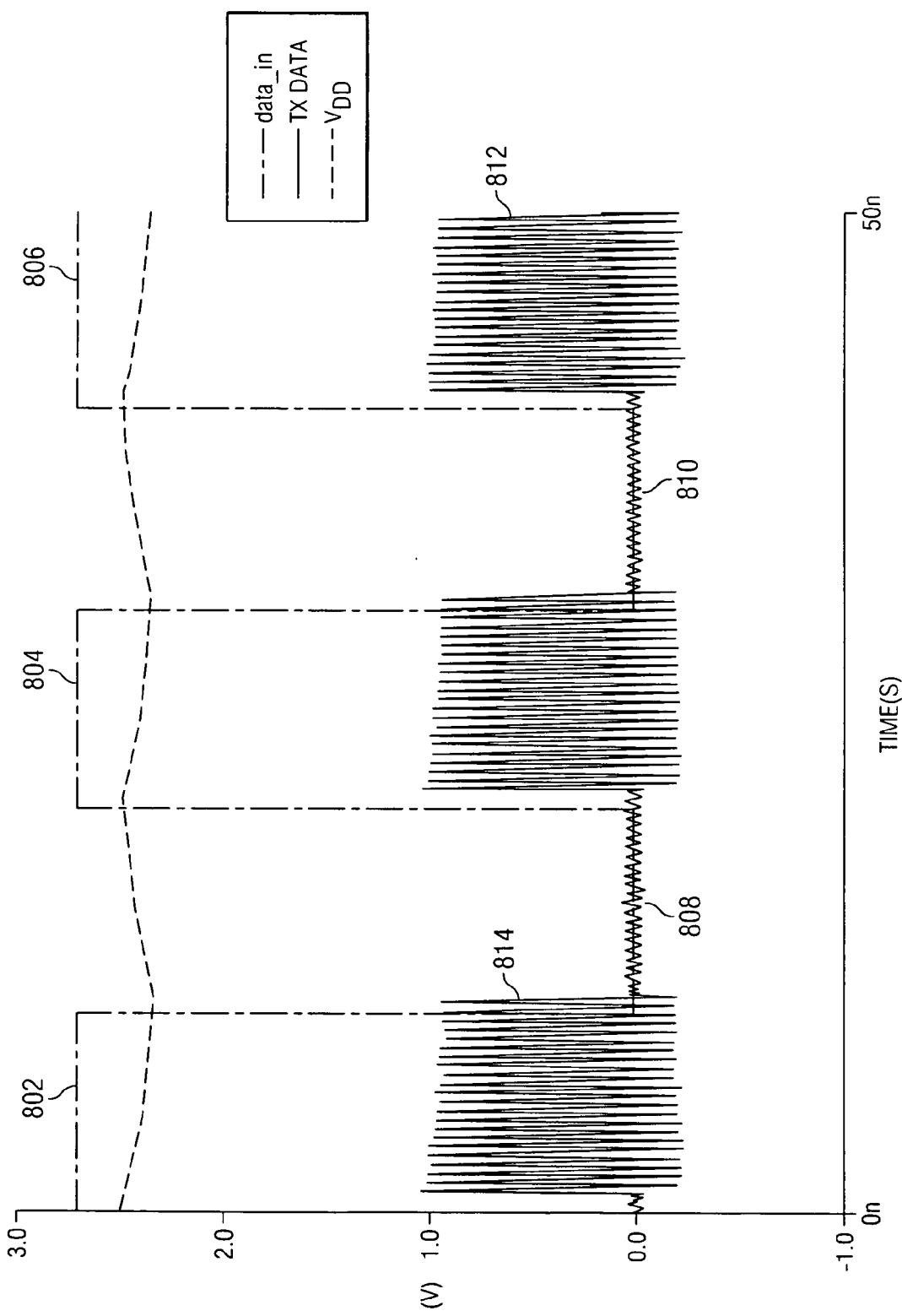
FIG. 8 illustrates the waveforms present on the transmit side of the RF isolation link of FIG. 7.
Figure 9:
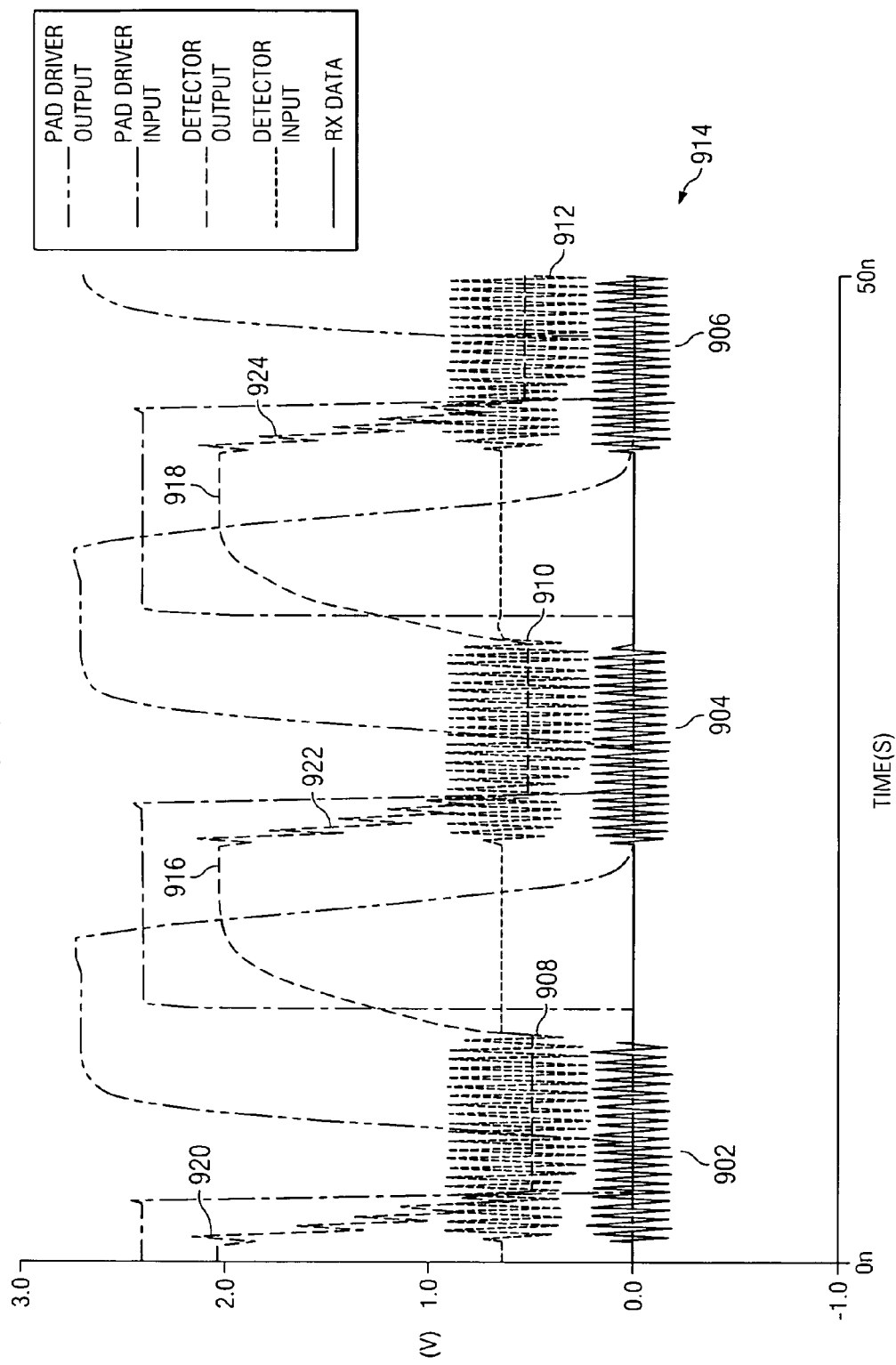
FIG. 9 illustrates the waveforms present on the receiving side of the RF isolation link of FIG. 7.

Referring now to FIGS. 8 and 9, there are illustrated the waveforms and data provided at the transmission side (FIG. 8) of an RF isolation link 600 and the receive side (FIG. 9) of the RF isolation link. On the transmission side illustrated in FIG. 8, the data 800 is either transmitted as a one bit (high) or zero bit (low). A one bit pulse is indicated at 802, 804 and 806. A zero bit pulse is indicated at 808 and 810. The transmit data provided to the transformer 714 is illustrated by the waveform 812. The transmit data waveform represents the 2 GHz RF carrier signal. When a logical "1" data bit is being transmitted and the data signal is high, the presence of the 2 GHz RF carrier is provided at the transmit data output. When a logical "0" bit is being transmitted, the signal is virtually zero at the transmit data output. Thus, whether a logical "1" bit or a logical "0" bit is transmitted is indicated either by the presence or absence of the 2 GHz RF carrier signal.

FIG. 9 illustrates the waveforms associated with the receiver 704. The received data for the logic "1" bit is represented at points 902, 904 and 906 and indicates the three 2.5 GHz RF carrier pulses transmitted from the transmitter 702 of the RF isolation link 600. The received pulses are amplified by the amplifier 705 such that when the signal is input to the detector circuit 706, the pulses are represented by the amplified waveform pulses 908, 910 and 912. As discussed previously, the detector data output rises to $V_{DD}$ at points 916, 918 when no RF carrier signal is detected by the detector 706 indicating a logical "0." When an RF carrier signal is detected, the output of the detector 706 begins to vary and drops low at points 920, 922 and 924 indicating a logical "1," this being the result of an increase in the NMOS current in transistor 736.

Figure 10:
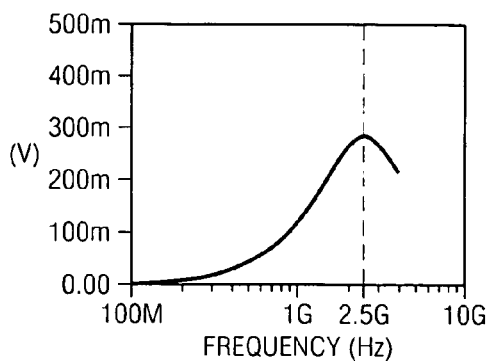
FIG. 10 illustrates the frequency response of the RF isolation link.
Figure 12:
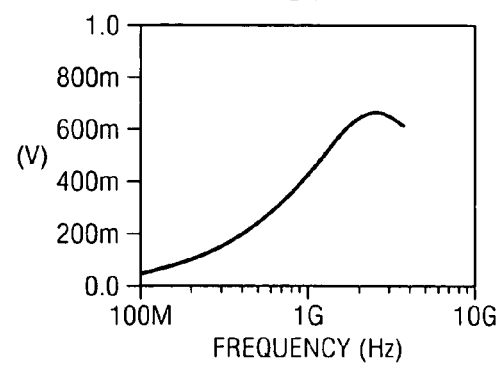
FIG. 12 illustrates the frequency response of one transformer of the RF isolation link.

Referring now to FIG. 10, there is illustrated the frequency response of a channel having the RF isolation circuit 600 described in FIG. 7.

Figure 11:
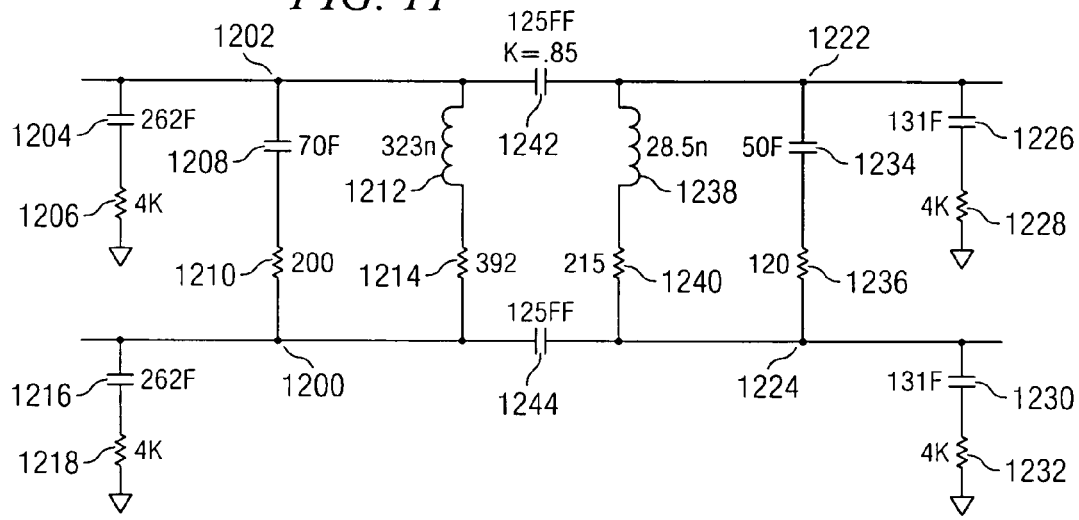
FIG. 11 illustrates a model of one of the transformers included within the RF isolation link.

Referring now to FIG. 11, there is illustrated a model for the transformers (714, 718) illustrated in FIG. 7. The input of the transformer consists of nodes 1002 and 1100. Node 1002 is connected to ground through capacitor 1104 and resistor 1106. Node 1100 is connected to ground through capacitor 1116 and resistor 1118. Node 1102 interconnects with node 1100 via a parallel connection of capacitor 1108 in series with resistor 1110 and inductor 1112 in series with resistor 1114. The output of the transformer consists of nodes 1122 and 1124. Node 1122 is connected to ground through capacitor 1126 and resistor 1128. Node 1124 is connected to ground through capacitor 1130 and resistor 1132. Node 1122 interconnects with node 1124 via a parallel connection of capacitor 1134 in series with resistor 1136 and inductor 1138 in series with resistor 1140. Nodes 1102 and 1122 are interconnected via a capacitor 1142 with a value of approximately 125 Ff. Nodes 1100 and 1124 are interconnected via a capacitor 1144 with a value of approximately 125 Ff.

Figure 13:
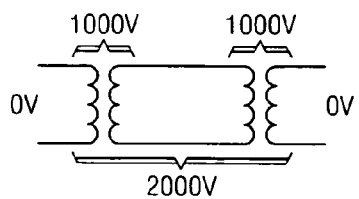
FIG. 13 illustrates the voltages across each transformer included within an RF isolation link and across the entire RF isolation link.

With specific reference to FIG. 13, it can be seen that the low frequency response of the transformers is relatively lossy whereas the peak of the response occurs around 2.5 GHz. This is due to the manner in which the transformer was fabricated. Each side of the transformer is comprised of an inductive element, each inductive element on either side of the transformer coupled together through a layer of dielectric material, as will be described herein below. The series inductance value will result in an effect on the frequency response that will somewhat narrow the frequency response thereof. The amount of energy that is coupled from the output is a function of the coupling coefficient. The two sides of the transformers are disposed on a substrate, as will be described herein below, such that one element is disposed over the other element and separated therefrom by a high voltage dielectric to increase the effective breakdown voltage. This will allow high frequency energy to be coupled from one conductive element to the other. The voltage breakdown is a function of the properties of the material disposed between the two conductors at DC and the distance by which the two are separated. If the transformer were fabricated on a single layer of material in the semiconductor substrate, then the distances between the edges thereof would define the voltage breakdown. For example, the transformer device could be fabricated with the use of a directional coupler, which would provide a more broadband response. However, the area for such a design could be significant.

It can be seen that, due to the low frequency attenuation of the transformer, it would be difficult to couple through energy from a DC pulse, since only the high frequency energy would be passed there through. As such, the spectral energy that is coupled through the transformer of the present disclosure is concentrated therein with the use of a high frequency carrier that is disposed substantially within the center of the frequency response of the transformer. This will allow a large portion of the energy generated to be coupled across the transformer.

Figure 16:
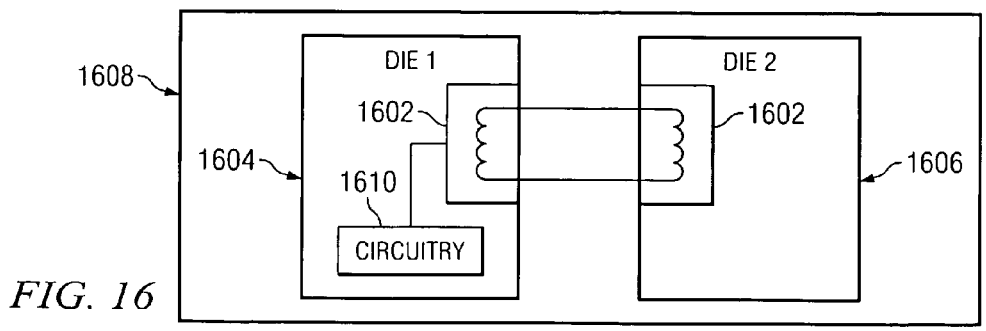
FIG. 16 illustrates an integrated RF isolation link in a single package including two dies.

Using the RF isolation links 600 described above, voltage isolation of up to 5,000 volts may be achieved, 2,500 volts for each side. Thus, as illustrated in FIG. 16, the RF isolation circuit 602 may provide 5,000 volts of isolation between a first chip 602a and a second chip 602b. While the voltage between the input terminals of the chip 602a will be zero volts, and the voltage between the input terminals of the chip 602b will also be zero volts, the total voltage difference between the two chips may be 5,000 volts with a 2,500 voltage difference across each of the transformers 714, 718 associated with the interfaces to the RF isolation circuit on each chip 602.

Figure 14A:
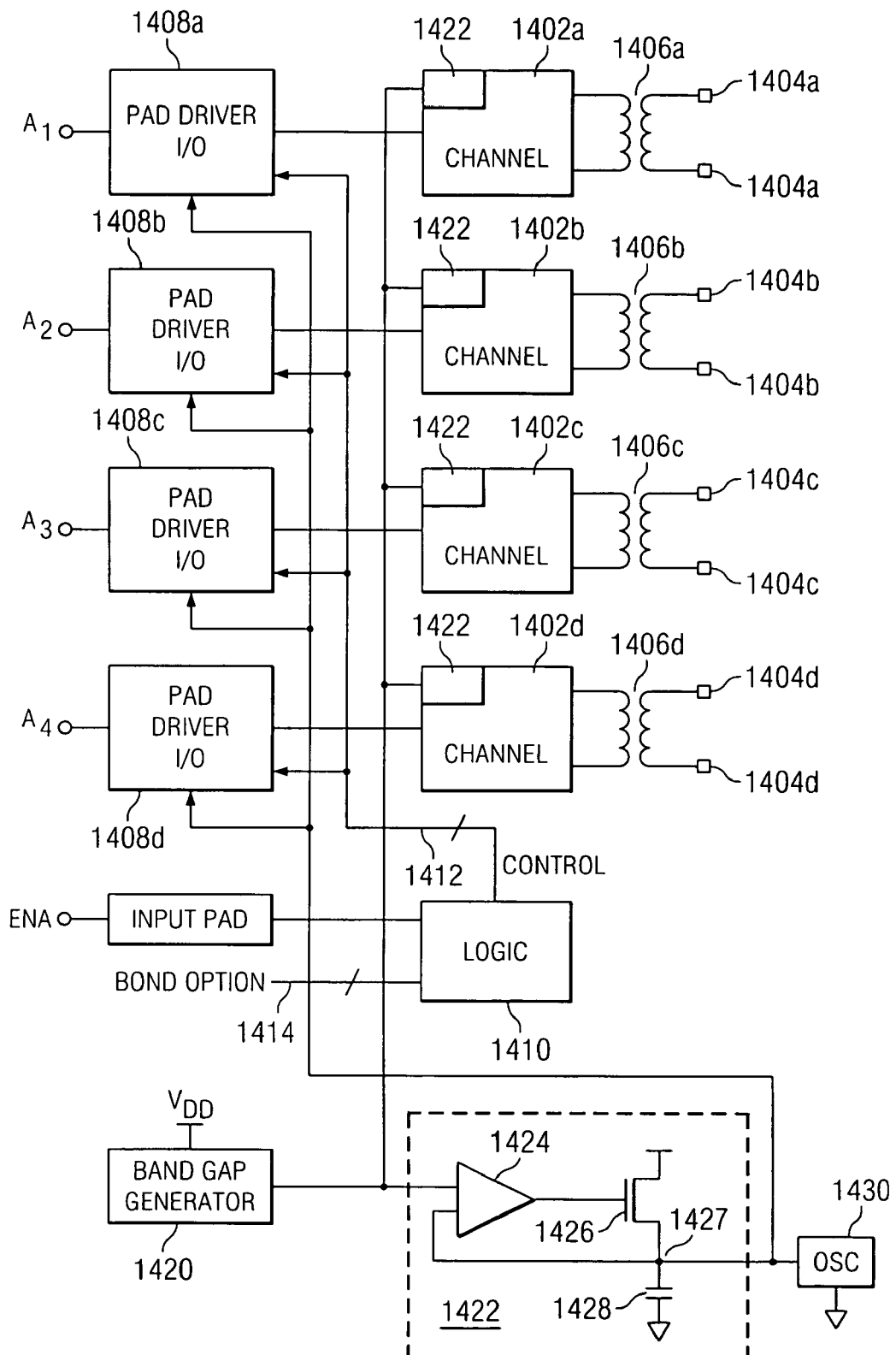
FIG. 14a is a block diagram illustrating the circuitry included within a chip on one side of an RF isolation link for providing multiple isolation link channels.

Referring now to FIG. 14a, there is illustrated a block diagram of the structure of an interface of a single chip 602 including a portion of a plurality of channels 1402 including the RF isolation link of the present disclosure. Each channel 1402 consists of the transformer 1406 and transmit and/or receive circuitry described with respect to FIG. 7. Data may be either input or received at the interface 1404 of transformer 1406. Each channel 1402 is interconnected with a pad driver 1408 that either drives transmitted data from the pad driver over channel 1402 to be output over the interface 1404 or drives received data to the associated pad of the chip 602. The manner in which data can be either transmitted or received over a particular channel 1402a is controlled on the chip 602 by logic circuitry 1410 providing control over various control lines 1412. The manner in which the logic control 1410 controls whether a channel is used for transmitting or receiving is set by input bond pad options 1414. Thus, in this embodiment, data is received as either a logic "1" or a logic "0" and the associated transformer is driven, when a pad is configured as a transmitter, (or not driven) accordingly. For received data on the associated transformer, when configured to receive data, the output of the pad is either high or low.

An oscillator circuit 1430 is also associated with all of the channels of the interface. A band gap generator 1420 is provided on-chip and connected to $V_{DD}$ to provide a band gap reference voltage to a regulator circuit 1422. While the description with respect to FIG. 14a only illustrates a single voltage regulator 1422, it will be noted that a separate voltage regulator 1422 will be associated with each of the channels of the interface for noise purposes. The voltage regulator 1422 consists of an amplifier 1424 having one input connected to the output of the band gap generator 1420. The output of the amplifier 1424 is connected to the gate of a transistor 1426. The drain-source path of the transistor 1426 is connected between $V_{DD}$ and a node 1427. Node 1427 is also connected to the second input of the differential amplifier 1424. A capacitor 1428 is connected between node 1422 and ground. Each of the channels 1402a, 1402b, 1402c and 1402d has a regulator 1422 associated therewith. Connected to node 1427 is an oscillator circuit 1430.

Figure 14B:
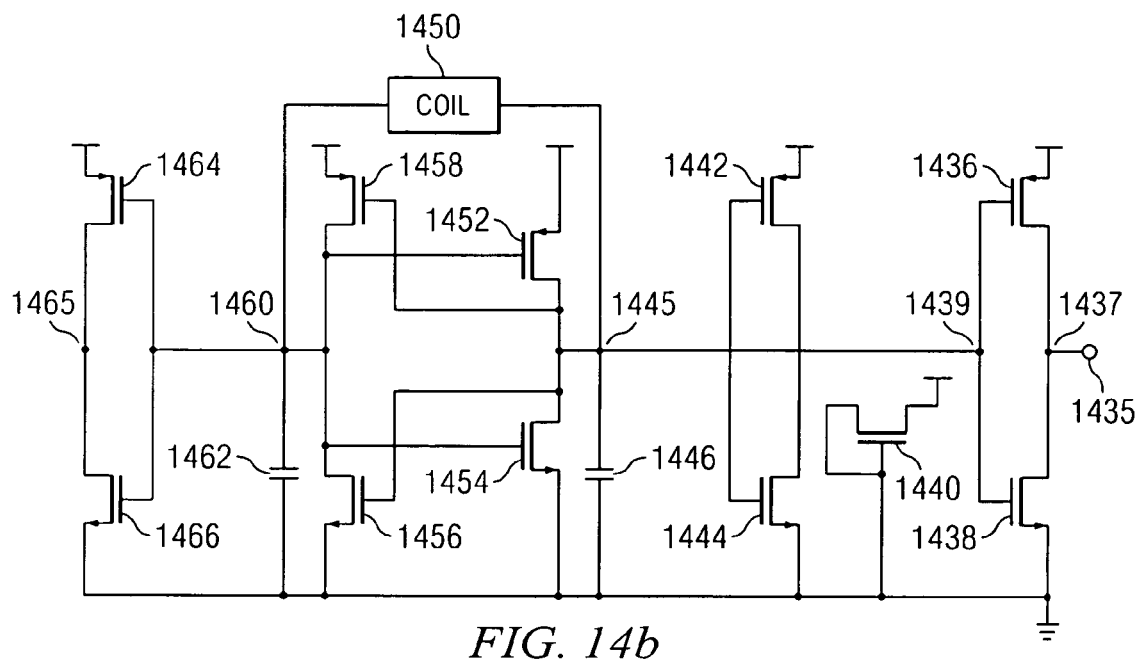
FIG. 14b is a schematic diagram of an oscillator circuit.

FIG. 14b illustrates the oscillator circuit 1430 of FIG. 14a. The output 1435 is connected to node 1437 between transistor 1436 and transistor 1438. The drain-source path of transistor 1436 is connected between $V_{DD}$ and node 1437. The drain-source path of transistor 1438 is connected between node 1437 and ground. The gates of transistor 1436 and 1438 are connected to each other through a node 1439. A transistor 1440 has its gate connected to ground and its drain-source path connected between $V_{DD}$ and the gate of transistor 1440. Node 1439 also interconnects transistor 1442 and transistor 1444. The drain-source path of transistor 1442 is connected between $V_{DD}$ and node 1439. The drain-source path of transistor 1444 is connected between node 1439 and ground. The gates of transistors 1442 and 1444 are interconnected with each other via node 1445. A capacitor 1446 is connected between node 1445 and ground. Node 1445 is connected to a first terminal of coil 1450. The second terminal of coil 1450 interconnects with the circuit via node 1460. Transistors 1452 and 1454 are interconnected via node 1445. The drain-source path of transistor 1452 is connected between $V_{DD}$ and node 1445. The drain-source path of transistor 1454 is connected between node 1445 and ground. The gates of both transistor 1452 and 1454 connect to node 1460. Transistors 1458 and 1456 are interconnected via node 1460. The drain-source path of transistor 1458 is connected between $V_{DD}$ and node 1460. The drain-source path of transistor 1456 is connected between node 1460 and ground. The gates of transistors 1458 and 1456 connect to node 1445. The capacitor 1462 is connected between node 1460 and ground. Also connected to node 1460 are the gates of transistors 1464 and 1466. The drain-source pathway of transistor 1464 is connected between $V_{DD}$ and node 1465, and the drain-source pathway of transistor 1466 is connected between node 1465 and ground. This oscillator therefore comprises a conventional LC oscillator.

Figure 14C:
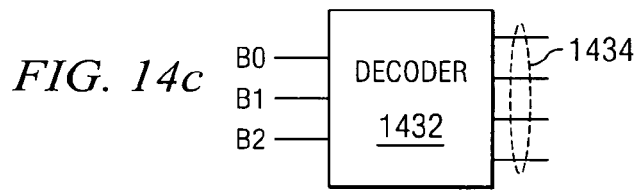

Referring now to FIG. 14c, there is illustrated one embodiment of the circuitry which might be incorporated within the logic circuit 1410. In this embodiment, the logic circuit 1410 includes of a decoder 1432. The decoder has a total of three bond pad inputs B0, B1 and B2 for receiving the indication of the version of the chip being implemented. The outputs 1434 of the decoder are input to the appropriate channels such that the channel may be configured in either a transmission or reception mode.

Figure 15:
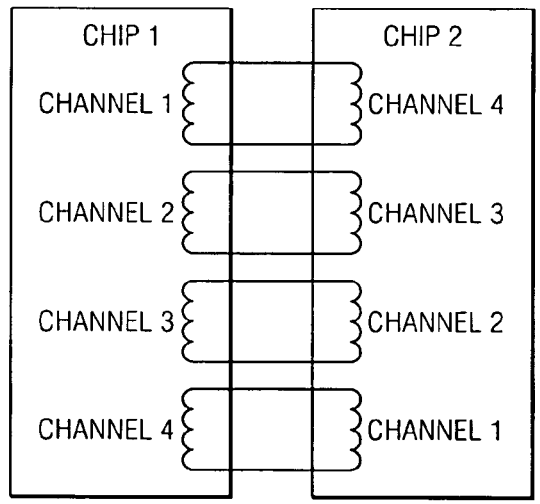
FIG. 15 illustrates a pair of chips within a single package including four separate channels for providing four isolated digital data links.

Referring now also to FIG. 15, there is illustrated the manner in which the single chip design described in FIG. 16 can be used to facilitate an entire RF isolation circuit including four separate RF isolated channels. A first chip 1502 is reversed such that the output channels 1402 between the first chip 1502 and the second chip 1504 are merely reversed. Thus, when viewing the chip 1502 from top to bottom of chip one, channel one is at the top, channel two is second, channel three is third and channel four is last. For the second chip 1504, the channels run in the opposite direction with channel one beginning at the bottom and channel four being at the top. The physical design of chip 1502 and chip 1504 are the same. Chip 1504 is merely reversed to facilitate the three versions of the chip as described below. Three different bond option versions may be selected for input to the logic circuit 1410 of the package containing the first chip 1502 and the second chip 1504 utilizing the decoder circuit 1432. Referring now to the Table 1, there are illustrated the three separate versions of operation for both the first chip 1502 and the second chip 1504 and the indication of whether the channel comprises a transmit or receive channel in the associated version.

TABLE 1

| Version | Chip | Ch. 1 | Ch. 2 | Ch. 3 | Ch. 4 |
|---|---|---|---|---|---|
| 1 | 1 | Tx | Tx | Tx | Tx |
| 2 | 1 | Tx | Tx | Rx | Rx |
| 3 | 1 | Tx | Rx | Rx | Rx |
| 1 | 2 | Rx | Rx | Rx | Rx |
| 2 | 2 | Tx | Tx | Rx | Rx |
| 3 | 2 | Rx | Tx | Tx | Tx |

As can be seen, the associated chips 602 and 604 channels correspond, such that when a channel on one chip is transmitting or receiving, the corresponding channel on the other chip is doing the opposite.

Figure 15A:
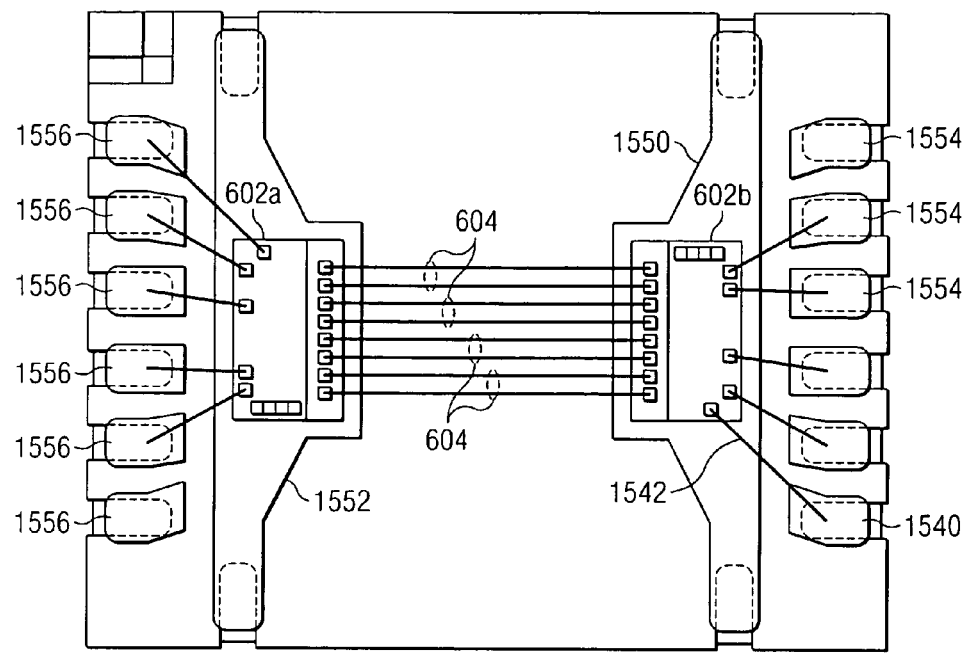
FIG. 15a illustrates the RF isolation link within a chip package.

Referring now to FIG. 15a, there is illustrated the RF isolation link 600 within a chip package. As discussed previously in FIG. 15, there are illustrated chips 1602a and 1602b interconnected by four separate channels 604. Each channel 604 is represented by two bond wires interconnecting the transformers (not shown) within each of chips 1602a and 1602b. Each of chips 1602a and 1602b are also connected to various bond pads 1504 within the package by a connection line 1542 that provide connections to the other electronic circuitry.

The embodiment of FIG. 15a is referred to as a "split lead-frame" package. This is facilitated with the use of a lead frame 1550 on one side thereof and a lead frame 1552 on the other side thereof. Lead frame 1550 is interfaced with terminals 1554 and lead frame 1550 is interfaced with terminals 1556. During fabrication, the lead frames 1550 and 1556, which are not electrically connected to each other, provide support for the chips 602a and 602b, respectively. When the chips 602a and 602b are bonded onto their respective portions of the lead frame, they are then bonded to the appropriate terminals 1554 and 1556 and then the bond wires 604 disposed there between. The entire package is then encapsulated in a conventional encapsulate. Thus, the bond wires 604 each comprise a high frequency transmission line disposed between the two chips, each transformer associated with two band wires that provide a "two-wire" transmission line.

Figure 15B:
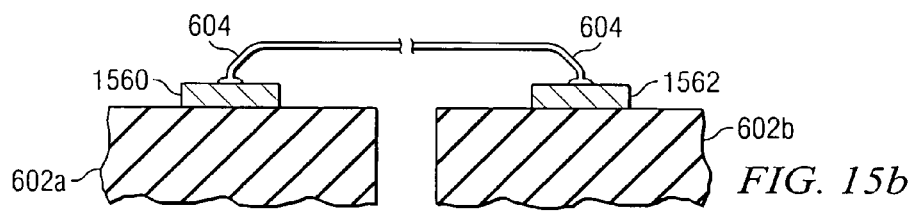
FIG. 15b illustrates a side view of one of the bond wires.

Referring now to FIG. 15b, there is illustrated a side view of one of the bond wires 604. It can be seen that the substrate associated with the die 602a has disposed thereon a bonding pad 1560 and the die 602b has disposed thereon a bonding pad 1562. The bond wire 604 is bonded to the pad 1516 on one side with a conventional bond and also to the pad 1562 on the die 602b. The length of the bond wire 604 is a fraction of a wavelength at the 2.4 GHz frequency. However, it will be inductive in nature and will have distributed inductance and capacitance associated therewith. As such, the transmission characteristics of the bond wire can affect the transmission of information between the two dies 602a and 602b. As noted herein above, the input impedance to each of the pads 1560 is on the range of 500 ohms. Thus, for ideal transmission of the information, there might be some matching circuitry required in addition to just the bond wires 604 forming the two-wire transmission line, although that has not been set forth herein.

Referring now to FIG. 16, there is illustrated the manner in which the RF isolation link 600 represented as RF isolation circuitry 1602 may be integrated into two separate multifunctional dies, 1604 and 1606, within a single package 1608. The RF isolation circuitry 1602 may provide isolation between components on two separate dies 1604 and 1606. Associated with one or both of the dies could be additional circuitry 1610 such as a microcontroller or other electronic component. This additional circuitry would be isolated from components in the other die via the RF isolation link 1602.

Figure 16A:
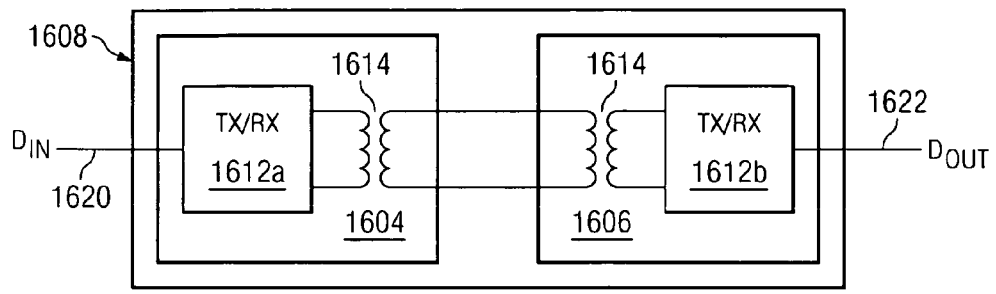
FIG. 16a illustrates an integrated RF isolation link in a single package having a digital input and a digital output.

Referring now also to FIG. 16a, when an RF isolation link 600 is integrated onto two separate dies 1604 and 1606 in a single package 1608. The isolation interface 1602, which includes the transceivers 1612 and the transformers 1614, may be used to provide simply a digital IN, digital OUT package 1608. In this embodiment, the digital input 1620 is applied to a first transceiver 1612a. Alternatively, the digital input 1620 could be applied to digital circuitry connected to the transceiver 1612a. The isolation circuit operates in the manner described herein above and a second digital output 1622 is provided from transceiver 1612b or associated digital circuitry.

Figure 16B:
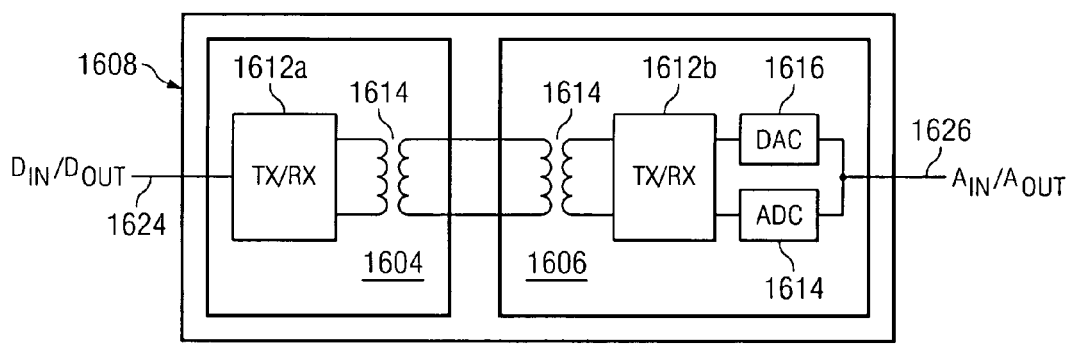
FIG. 16b illustrates an integrated RF isolation link in a single package including a digital input/output and an analog input/output.

Referring now to FIG. 16b, rather than providing a solely digital input/digital output circuit, a single package 1608, including first and second dies 1604, 1606 implementing the RF isolation circuit described herein above, may provide a circuit with a digital input/output and an analog input/output. In this case, a digital input/output 1924 would connect with transceiver 1612a or digital circuitry of a first die 1604. The first die 1604 is coupled with the second die 1606 via the described RF isolation link, and the transceiver 1612b is coupled to an analog input/analog output 1626 through a data converter, either an ADC 1614 or a DAC 1616, depending upon the direction.

Figure 16C:
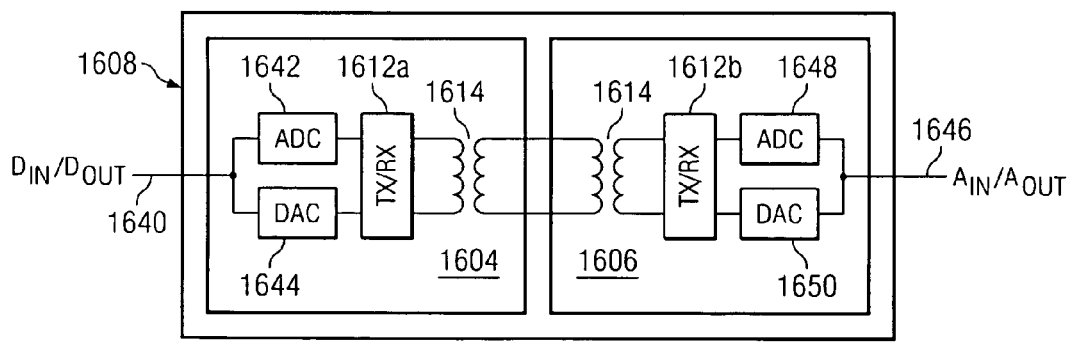
FIG. 16c illustrates an integrated RF isolation link in a single package including an analog input/output and an analog input/output.

Referring now to FIG. 16c, a single package 1908, including first and second dies 1604, 1606 implementing the RF isolation circuit described herein above, may provide a circuit with an analog input/output and on one side and an analog input/output on the other side. In this case, an analog input/output 1640 would connect to an A-D converter 1642 and a D-A converter 1644 and then to the transceiver 1612a or digital circuitry of a first die 1604. The first die 1604 is coupled with the second die 1606 via the described RF isolation link, and the transceiver 1612b is coupled to an analog input/output 1646 via an A-D converter 1648 and D-A converter 1650. In this way, analog signals may be transmitted in either direction across the single package 1608.

Figure 17A:
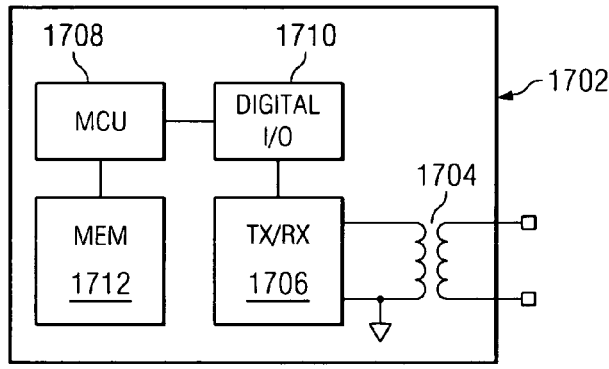
FIG. 17a illustrates an RF isolation link integrated with a microcontroller.

Referring now to FIG. 17a, there is illustrated a chip 1702 including a portion of the RF isolation link described herein above. The chip 2002 includes a single transformer 1704 and the transmit and receive circuitry 1706 of the RF isolation link 600. The RF isolation link 600 consisting of the transceiver 1706 and the transformer 1704 are integrated with a microcontroller unit 1708 through a digital input/output 1710. A memory 1712 stores operating instructions and data needed by the microcontroller unit 1708. The chip 1702 would be able to interconnect with a second chip that included an interface consisting of a transformer 1704 and transceiver 1706 similar to that included within the chip 1702. By interconnecting to such chips, the microcontroller 1708 and the interconnected chip would be voltage isolated from each other via the complete RF isolation link between them.

The transmit and receive circuitry 1706 is part of the I/O interface for the integrated circuit. One type of integrated circuit that provides the overall functionality of that illustrated in FIG. 17a is a conventional microcontroller unit of the type C8051FXXX, manufactured by the present Assignee. This chip provides onboard processing through the MCU 1708, interface to the analog domain and interface to the digital domain. This integrated circuit also has the ability to configure the various outputs and, as such, a digital output could be provided on a serial interface for driving the transmit/receive circuitry 1706 or receiving the serial data therefrom.

The process of fabricating the MCU 1708, memory 2012 and the digital I/O 1710, in addition to the various analog-to-digital data converters or digital-to-analog data converters is fairly complex. As such, the transmit and receive circuitry 1706 and the transformer 1704 must be compatible with the process rather than making the process compatible with the transformer. As will be described herein below, there are a plurality of metal layers utilized to fabricate various interconnects associated with fabrication of the integrated circuit. By utilizing the various metal layers that are already present in the fabrication process, the two sides of the transformer 1704 can be fabricated and isolated from one another with sufficient isolation to provide adequate over voltage protection. Additionally, due to the high voltages and the high frequency of the transformer, the transformer 1704 is actually disposed in a separate portion of the chip surface area such that it does not overlie any of the circuitry associated with the digital operation or the analog operation, since this is a mixed-signal integrated circuit.

Figure 17B:
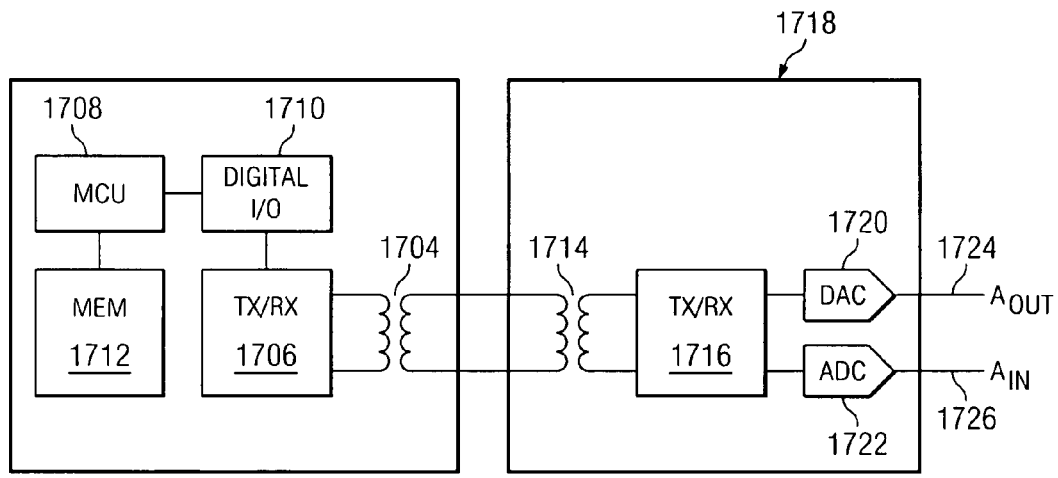
FIG. 17b illustrates an RF isolation link integrated with a microcontroller interconnected to a second chip providing both analog input and analog output.

One example of this is illustrated in FIG. 17b, wherein the chip 1702 including an RF isolation link consisting of transformer 1704 and transceiver 1706 is integrated with a microcontroller unit 1708 through a digital input/output 1710. The MCU 1708 also includes an associated memory 1712. In this case, the first portion of the RF isolation link consisting of a transformer 1704 and transceiver 1706 is interconnected with a second portion of the RF isolation link consisting of transformer 1714 and transceiver 1716. In this case, the chip 1718 including the second portion of the RF isolation link includes a digital-to-analog converter 1720 and an analog-to-digital converter 1722 for converting the digital output of the transceiver 1716 of the RF isolation link into an analog output and for converting received analog inputs into digital inputs. The chip 1718 enables both the output of an analog signal at analog output 1724 and the input of analog signals at analog input 1726. These analog signals may then be used in any desired fashion by a circuit designer.

Figure 18A:
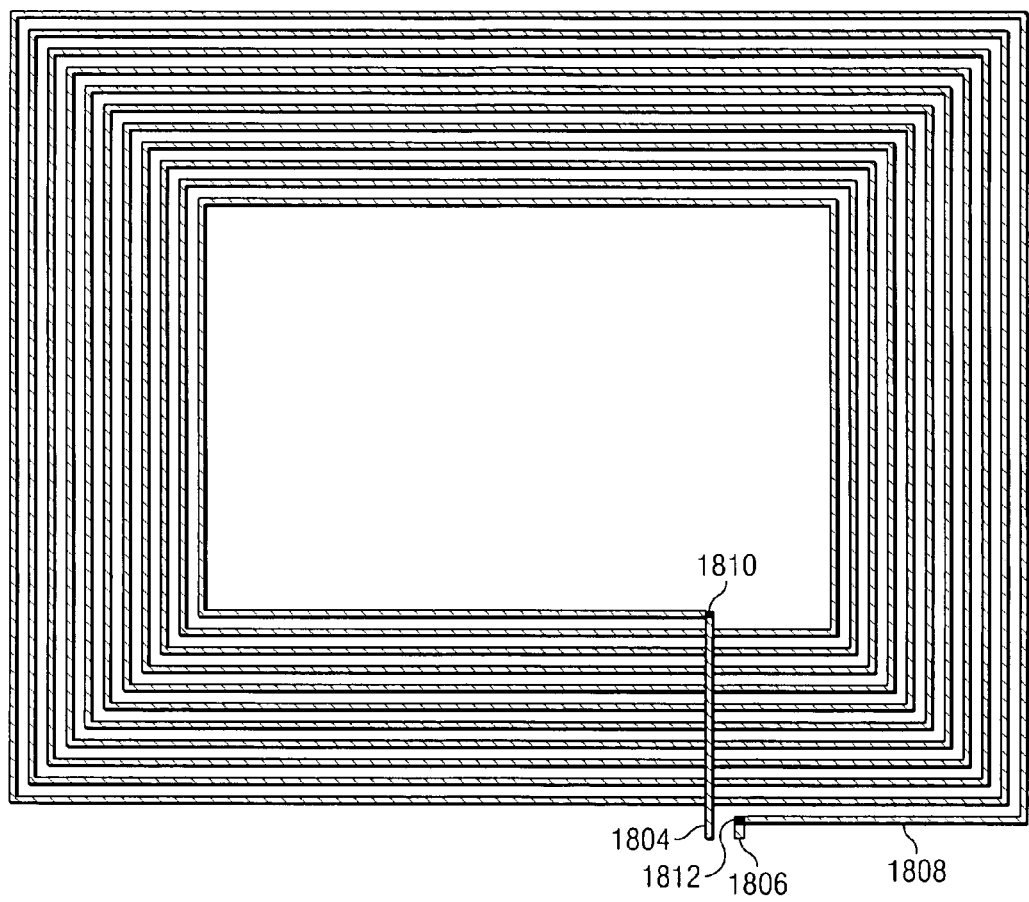
FIG. 18a illustrates one coil of a transformer of the RF isolation link.
Figure 18B:
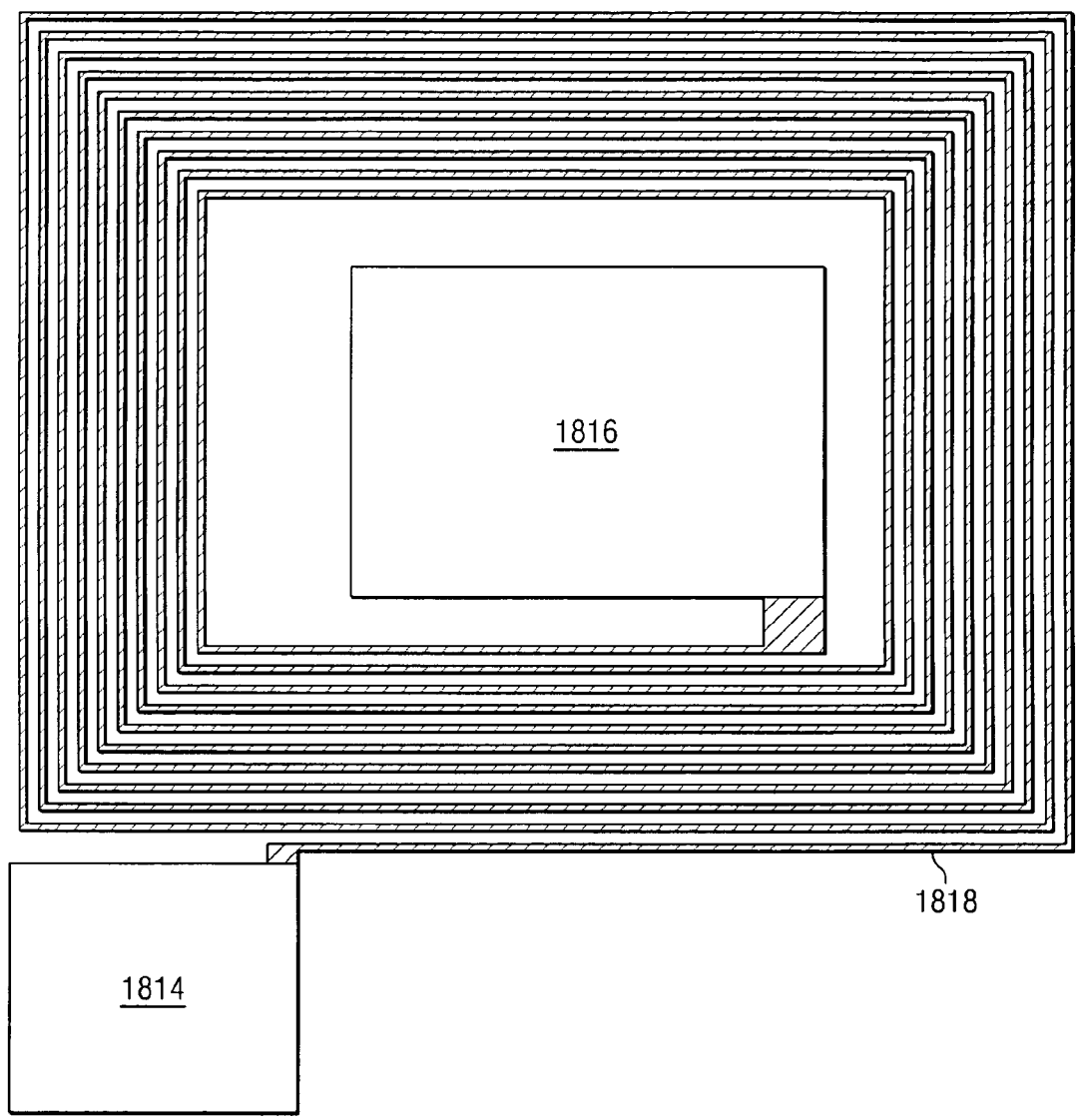
FIG. 18b illustrates a second coil of a transformer of the RF isolation link.

Referring now to FIGS. 18a, 18b, 19 and 20, there is illustrated the structure of the transformer coils of transformer 714 or 718 (FIG. 7) integrally formed on a CMOS device. Each transformer 714 and 718 is integrated as a part of one of the chips or dies including the RF isolation link. Referring more particularly to FIGS. 18a and 18b, there are illustrated the two coils included in each of transformers 714 or 718. A first coil 1802 consists of a first terminal 1804 and a second terminal 1806 formed in the metal layer of a chip referred to as the "Metal 1" layer. Each of the terminals in the Metal 1 layer are connected to the transformer coil 1808 which resides on a second metal layer of a chip referred to as the "Metal 2" layer. A conductive via 1810 interconnects the coil 1808 with terminal 1804. A second connective via 1812 interconnects the coil 1808 with the second terminal 1806. A second coil resides upon a fifth metal layer referred to as the "Metal 5" layer. This coil consists of a first bonding pad 1814 and a second bonding pad 1816. Each of the first and second conductive pads 1814, 1816 are interconnected by a second coil 1818 encircling pad 1816 and interconnecting with pad 1814. Unlike the coil described in FIG. 18a, coil 1818 includes both the bonding pads 1814, 1816 and the coil 1818 on the same metal layer (Metal 5).

Figure 19:
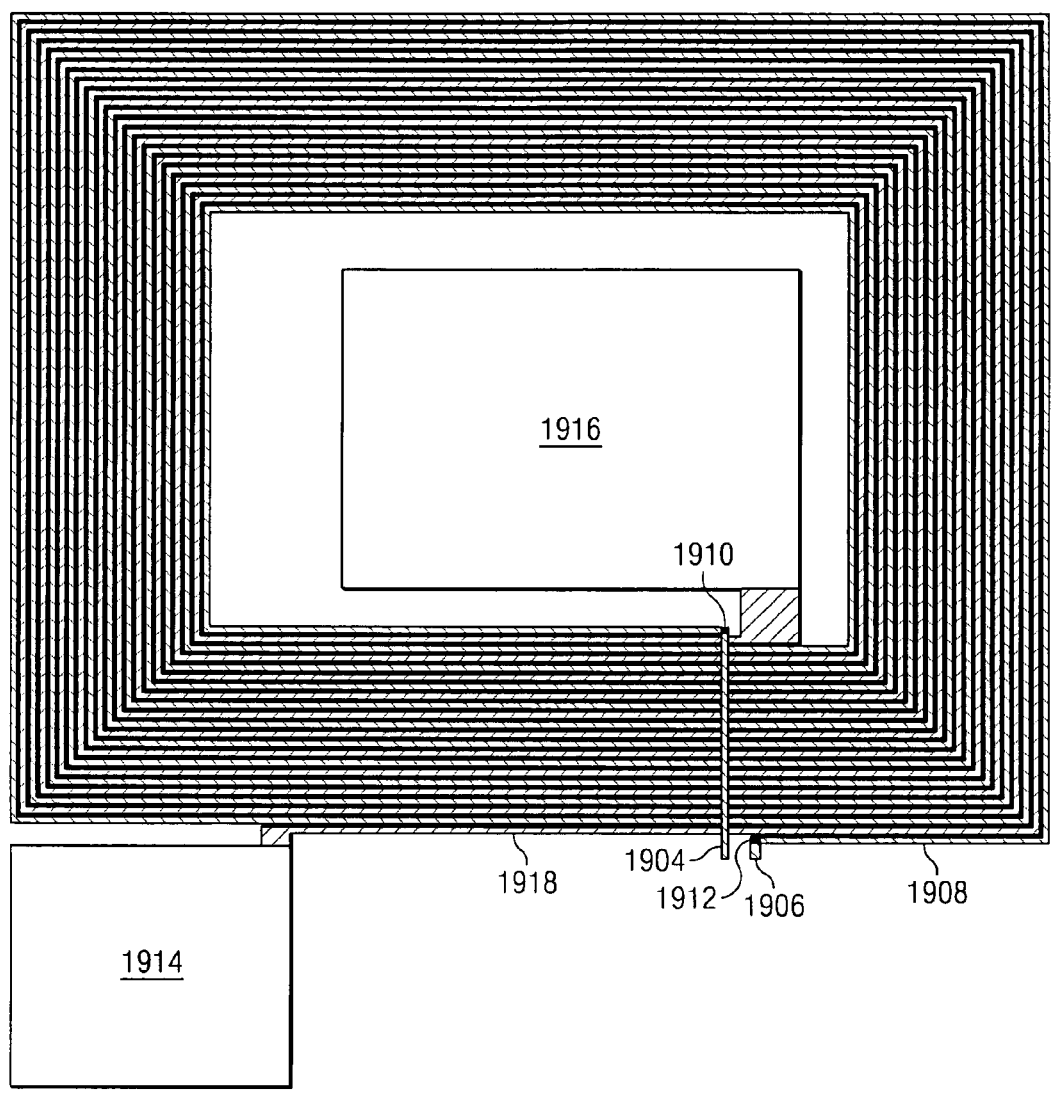
FIG. 19 illustrates an overlapping view of the transformers described in FIGS. 21a and 21b.

Typically, the Metal 5 layer is the uppermost layer. Referring now also to FIG. 19, there is illustrated the overlapping view of the first and second coils of a transformer on a chip. It can be seen that the pad 1816 is dimensioned such that it is $\frac{1}{32}$ µn×94 µn. The entire coil is dimensioned to be 268 µm by 205 µm. The pad 1814 is dimensioned to the 70 µm×80 µm. The two coils 1818 and 1808 are similar in their configuration and are oriented such that they are substantially "non-overlapping." However, they could overlap.

Figure 20:
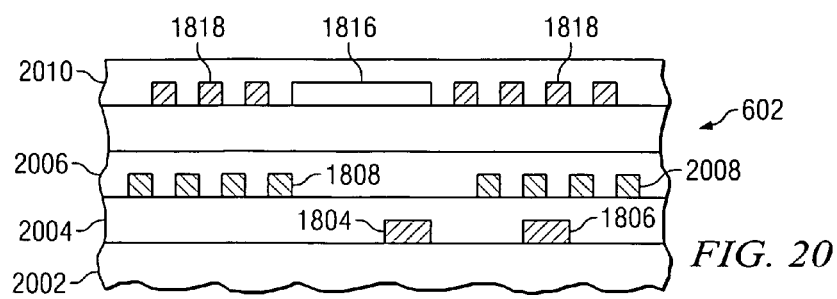
FIG. 20 is a side view of the coils forming a transformer of the RF isolation link.

Referring now to FIG. 20, there is illustrated a side view of a chip 602 containing a transformer structure as described with respect to FIGS. 18a, 18b and 19. The chip 602 includes a substrate layer 2002 containing the transceiver circuitry of the RF isolation link and any electronic circuitry integrated with the RF isolation link as discussed previously. The Metal 1 layer 2004 resides upon the substrate 2002 and includes the first and second terminals 1804, 1806 of the first transformer coil. On top of the Metal 1 layer is the Metal 2 layer 2006 containing the first coil 1808 interconnected by vias to the first and second terminals 1804 and 1806 (not shown). Finally, the Metal 5 layer resides over the Metal 2 layer 2008. The Metal 5 layer 2010 contains the other portion of the transformer, including the bond conduction pads 1816 and the bond pad 1814 (not shown) and the coil 1818 interconnecting the bond pad 1816 with the bond pad 1814. The Metal 1 layer for the transformer is utilized primarily to provide interconnects to the remaining of the circuits for the terminals 1804 and 1806. However, the process utilizes all five metal layers for the various interconnects. For the purposes of over voltage protection, it is desirable to separate the coil 1818 from the coil 1808 by as much distance as possible, realizing that the material disposed there between is silicon dioxide, a dielectric. An additional concern is the capacitor loading on the coil 1818 to ground, the substrate 2002 typically being disposed at ground. The high voltage will be present on the coil 1818 and, therefore, it is separated from both the substrate and the coil 1818 by as much distance as possible. Although the coil 1818 could have been fabricated in the Metal 1 layer, there would then have been a requirement to provide an interconnection from the ends of the coil to the circuitry. This would have required a "run" to be provided beneath the Metal 1 layer, which would required utilization of a polycrystalline layer. Even siliciding of the poly layer would not provide as good a conductive layer as that associated with a metal layer. As such, the configuration utilizes the Metal 1 layer for the interconnects and the Metal 2 layer for the coil.

Although it would be desirable to provide an even additional metal layer to further separate the coil 1818 from the coil 1808, it is not feasible to complicate a process with a special additional layer. The only reason that an additional layer would be utilized would be for the purpose of fabricating other circuitry on the integrated circuit. The reason for this is that, once a process is defined as being able to utilize multiple metal layers, substantially all circuits run through that process will use the multiple layers. It would be difficult to dedicate a process for a single integrated circuit that only used that additional metal layer and, therefore, the coil is fabricated from already existing metal layers in an existing process. However, if an additional metal layer were utilized in an existing process in the future, then it is possible that the coil 1818 would be disposed in an even higher layer than Metal 5.

Figure 21:
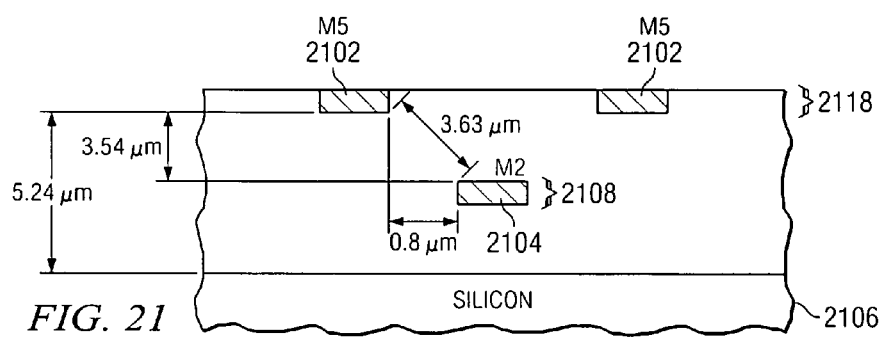
FIG. 21 illustrates an offset between metal layers to increase breakdown voltages within a transformer.

Referring now to FIG. 21, there is illustrated the offset used between metal runs 2102 of the coil 1818 on the Metal 5 layer and metal runs 2104 of the coil 1808 on the Metal 2 layer. Rather than having metal runs 2104 on the Metal 2 layer disposed directly below a metal run 2102 on the Metal 5 layer, they are offset diagonally from each other in order to increase the breakdown voltage between the components by increasing the distance. In the disclosed embodiment, the total distance between the Metal 5 layer run 2102 and the Metal 2 layer run 2404 is 3.63 µm. The Metal 2 layer run 2104 is vertically displaced from the Metal 5 layer run 2102 by 3.54 µms and horizontally displaced by 0.8 µm. The Metal 5 run layer 2102 is vertically separated from the silicon layer by 5.24 µm. This structure should provide a breakdown voltage between the Metal 5 and Metal 2 layers according to the equation $3.63 \times 10^{-6}$ m*$8 \times 10^8$ v/m=2904 v of breakdown voltage isolation. The breakdown voltage between the Metal 5 layer 2402 and the silicon layer 2406 can be determined according to the equation $5.24 \times 10^{-6}$ m*$8 \times 10^8$ v/m=4192 v.

Figure 22:
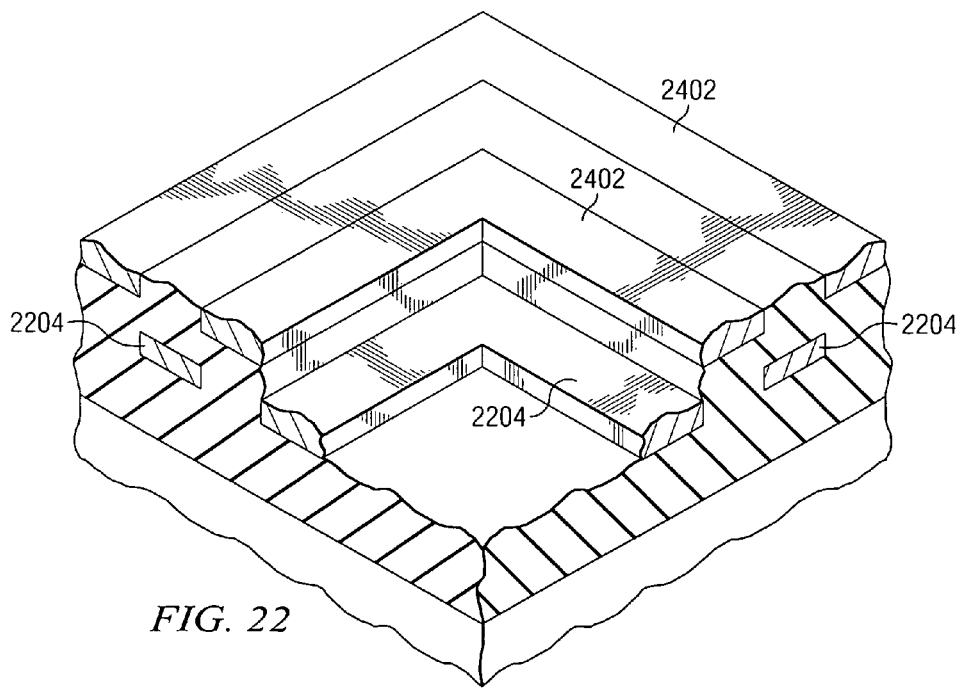
FIG. 22 illustrates a perspective cutaway view of the coil construction.

Referring now to FIG. 22, there is illustrated a cutaway perspective view of the coils 1818 and 1808 illustrated in FIG. 21. It can be seen that the metal runs 2104 are substantially the same shape as the metal runs 2102 but they are non-overlapping and separated by a dielectric layer. This illustration illustrates only a single corner of the coils.

Figure 23:
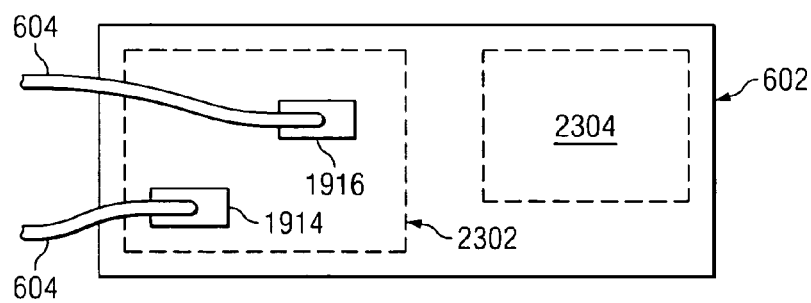
FIG. 23 illustrates the separate areas in which the transformer coils and the circuitry would be implemented on a chip utilizing the RF isolation circuit.

Referring now to FIG. 23, there is illustrated a chip 602 including an RF isolation link according to the present disclosure. The area of the chip 602 would be divided into at least two sections. A first section 2302 would contain the circuitry for providing the transformer for electromagnetically coupling with a transformer on another chip to provide the voltage isolation link between the chips. The remaining electronic circuitry of the chip would be located in a separate area 2304 and would include the transmitter and receiver circuitry of the voltage isolation link associated with the transformer as well as any electronic circuitry that would be integrated with the voltage isolation link, such as a micro controller or other type of electronic device. This would be repeated for multiple voltage isolation links for additional data paths. Additionally, it is noted that the layout is such that the area 2302 that contains the transformer on the upper surface thereof will have provided the pads 2116 in the center of the coil 2118 and the pad 2114 on the exterior thereof. The pad 2114 is located proximate the edge of the chip such that the bond wire 604 can be bonded thereto. Additionally, the pad 2116 is on the same surface as the pad 2114 such that the bond wire 604 associated therewith can be connected thereto. As such, there are no runs required to connect to the pad 2116 in a coil that would be required to run through other layers and run closer to the coils therein at right angles thereto. The bond wire 604 associated therewith will actually be disposed farther away from the actual metal runs 2102 associated with the coil 2118. An additional area could be included on the chip for additional electronic circuitry to be voltage isolated via a voltage isolation link on the same chip.

Figure 24:
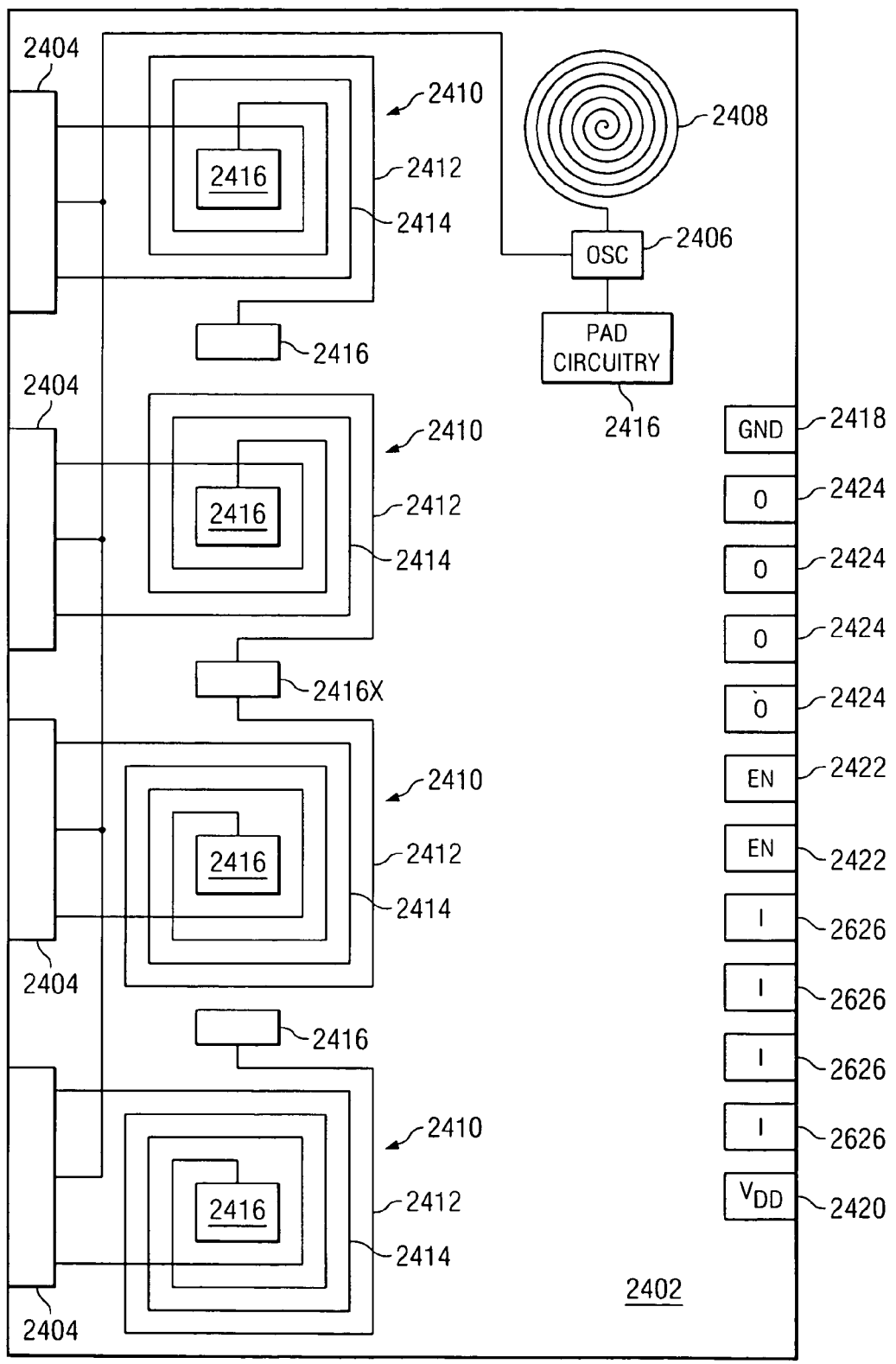
FIG. 24 illustrates the structure of the RF isolation link integrated on a single chip.

FIG. 24, illustrates the overall structure of the RF isolation link implemented on a chip 2402. Four separate interface connections 2404 provide connection of each of the four channels of the RF isolation link integrated into the chip 2402. Each of the four interfaces 2404 is linked with the oscillator 2406 and coil 2408. Connected to each of the interfaces 2404 are the transformers 2410 consisting of a first coil 2412 and a second coil 2414. Coil 2414 connects with the interface 2404 to provide interconnection with an external chip via the RF isolation link. Coil 2412 interconnects to bond pads 2416. It is noted that the channel one and channel four coils 2414 each include two separate bond pads 2416. However, the channel two and three coils 2414 each have a bond pad within the interior of the coil but share the external bond pad 2416x between channels two and three. Pad circuitry 2418 is associated with the oscillator circuit 2406 and the coils 2410. The pad circuitry 2418 is interconnected with the remainder of the circuitry on a chip 2402 via a number of bond pads. The bond pads comprise a ground bond pad 2418, a VDD bond pad 2420, two enable bond pads 2422, four output bond pads 2424 and four input bond pads 2426, one for each channel.

Utilizing the above described RF isolation circuit a high voltage isolation may be achieved between power supply chips while at the same time providing a relatively high speed data connection between these chips.

Although the preferred embodiment has been described in detail, it should be understood that various changes, substitutions and alterations can be made therein without departing from the spirit and scope of the invention as defined by the appended claims.

What is claimed is:

1. An integrated circuit having voltage isolation capabilities, comprising:
    a first area of the integrated circuit containing functional circuitry, the functional circuitry located in a substrate of the integrated circuit; and
    a second area of the integrated circuit containing integrated RF isolation circuitry for voltage isolating the functional circuitry, the RF isolation circuitry located in metal layers of the integrated circuit wherein the RF isolation circuitry further comprises:
        a first coil located on a first metal layer, the first coil connected to the functional circuitry;
        a second coil located on a second metal layer above the first metal layer and substantially non-overlapping the first coil, the second coil electromagnetically coupled to the first coil; and
        wherein runs of the first coil are diagonally offset from runs of the second coil.

2. The integrated circuit of claim 1, wherein the RF isolation circuitry further comprises:
    first and second terminals located on a third metal layer below the first metal layer for interconnecting the first coil with the functional circuitry.

3. The integrated circuit of claim 2, wherein the first metal layer and the second metal layer are separated by at least one dielectric layer.

4. The integrated circuit of claim 1, wherein the first metal layer is the metal one layer and the second metal layer comprises the metal five layer.

5. The integrated circuit of claim 1 further including:
    a first pad connected to a first end of the second coil and located within the second coil; and
    a second pad connected to a second end of the second coil and located substantially near an edge of the second coil.

6. The integrated circuit of claim 1, wherein the RF isolation circuitry further comprises a plurality of transformers, each of the plurality of transformers comprising:
    a first coil located on a first metal layer, the first coil connected to the functional circuitry;
    a second coil located on a second metal layer above the first metal layer and substantially non-overlapping the first coil, the second coil electromagnetically coupled to the first coil.

7. The integrated circuit of claim 6 wherein each transformer further includes:
    a first pad connected to a first end of the second coil and located within the second coil;
    a second pad connected to a second end of the second coil and located substantially near an edge of the second coil; and
    wherein at least two of the plurality of transformers share the second pad for the second coil.

8. The integrated circuit of claim 6 wherein each of the plurality of RF isolation interfaces further includes:
    a first pad connected to a first end of the second coil and located within the second coil;
    a second pad connected to a second end of the second coil and located substantially near an edge of the second coil; and
    wherein at least two of the plurality of RF isolation interfaces share the second pad for the second coil.

9. An integrated circuit having voltage isolation capabilities, comprising:
    a first area of the integrated circuit containing functional circuitry, the functional circuitry located in a substrate of the integrated circuit; and
    a second area of the integrated circuit containing integrated at least one RF isolation interface for voltage isolating the functional circuitry, the at least one RF isolation interface located in metal layers of the integrated circuit above the substrate, the at least one RF isolation interface comprising:
        a first coil located on a first metal layer, the first coil connected to the functional circuitry;
        a second coil located on a second metal layer above the first metal layer and substantially non-overlapping the first coil, the second coil electromagnetically coupled to the first coil;
        wherein runs of the first coil are diagonally offset from runs of the second coil;
        first and second terminals located on a third metal layer below the first metal layer for interconnecting the first coil with the functional circuitry;
        a first pad connected to a first end of the second coil and located within the second coil; and
        a second pad connected to a second end of the second coil and located substantially near an edge of the second coil.

10. The integrated circuit of claim 9, wherein the first metal layer and the second metal layer are separated by at least one dielectric layer.

11. The integrated circuit of claim 9, wherein the first metal layer is the metal one layer and the second metal layer comprises the metal five layer.

12. The integrated circuit of claim 9, wherein the at least one RF isolation interface further comprises a plurality of RF isolation interfaces, each of the plurality of RF isolation interfaces comprising:
    a first coil located on a first metal layer, the first coil connected to the functional circuitry;
    a second coil located on a second metal layer above the first metal layer and substantially non-overlapping the first coil, the second coil electromagnetically coupled to the first coil.

13. An integrated circuit having voltage isolation capabilities, comprising:
    a first area of the integrated circuit containing a first group of functional circuitry, the first group of functional circuitry located in a substrate of the integrated circuit;
    a second area of the integrated circuit containing a second group of functional circuitry, the second group of functional circuitry located in the substrate of the integrated circuit;
    a third area of the integrated circuit containing integrated RF isolation circuitry for voltage isolating the first group of functional circuitry from the second group of functional circuitry , the RF isolation circuitry located in metal layers of the integrated circuit; and
    wherein the RF isolation circuitry further comprises:
        a first coil located on a first metal layer, the first coil connected to the first group of functional circuitry;

a second coil located on a second metal layer above the first metal layer and substantially non-overlapping the first coil, the second coil electromagnetically coupled to the first coil a third coil located on the first metal layer, the third coil connected to the second group of functional circuitry; and a fourth coil located on the second metal layer above the first metal layer and substantially non-overlapping the third coil, the fourth coil electromagnetically coupled to the third coil and connected to the second coil.

14. The integrated circuit of claim 13, wherein the RF isolation circuitry further comprises:

first and second terminals located on a third metal layer below the first metal layer for interconnecting the first coil with the functional circuitry; and third and fourth terminals located on the third metal layer below the first metal layer for interconnecting the first coil with the second group of functional circuitry.

15. The integrated circuit of claim 13, wherein runs of the first coil are diagonally offset from runs of the second coil.

16. The integrated circuit of claim 13 wherein runs of the third coil are diagonally offset from runs of the fourth coil.

17. The integrated circuit of claim 13, wherein the first metal layer and the second metal layer are separated by at least one dielectric layer.

18. The integrated circuit of claim 13, wherein the first metal layer is the metal one layer and the second metal layer comprises the metal five layer.

19. The integrated circuit of claim 13 further including:

a first pad connected to a first end of the second coil and located within the second coil; and a second pad connected to a second end of the second coil and located substantially near an edge of the second coil;

a third pad connected to a first end of the fourth coil and located within the fourth coil; and a fourth pad connected to a second end of the fourth coil and located substantially near an edge of the fourth coil.

20. The integrated circuit of claim 19 wherein each transformer further includes:

a first pad connected to a first end of the second coil and located within the second coil; and a second pad connected to a second end of the second coil and located substantially near an edge of the second coil;

a third pad connected to a first end of the fourth coil and located within the fourth coil; and a fourth pad connected to a second end of the fourth coil and located substantially near an edge of the fourth coil; and wherein at least two of the plurality of transformers share the second pad for the second coil and share the fourth pad for the fourth coil.

21. The integrated circuit of claim 13, wherein the RF isolation circuitry further comprises a plurality of channels, each of the plurality of channels comprising:

a first coil located on a first metal layer, the first coil connected to the first group of functional circuitry;

a second coil located on a second metal layer above the first metal layer and substantially non-overlapping the first coil, the second coil electromagnetically coupled to the first coil a third coil located on the first metal layer, the third coil connected to the second group of functional circuitry; and a fourth coil located on the second metal layer above the first metal layer and substantially non-overlapping the third coil, the fourth coil electromagnetically coupled to the third coil and connected to the second coil.

* * * * *